(12) United States Patent
Ichinomiya

(10) Patent No.: US 8,143,913 B2
(45) Date of Patent: Mar. 27, 2012

(54) SEMICONDUCTOR INTEGRATED CIRCUIT, SEMICONDUCTOR INTEGRATED CIRCUIT CONTROL METHOD, AND TERMINAL SYSTEM

(75) Inventor: Takahiro Ichinomiya, Osaka (JP)

(73) Assignee: Panasonic Corporation, Osaka (JP)

( * ) Notice: Subject to any disclaimer, the term of this patent is extended or adjusted under 35 U.S.C. 154(b) by 303 days.

(21) Appl. No.: 12/375,853

(22) PCT Filed: Apr. 16, 2008

(86) PCT No.: PCT/JP2008/000997
§ 371 (c)(1),
(2), (4) Date: Jan. 30, 2009

(87) PCT Pub. No.: WO2008/132809
PCT Pub. Date: Nov. 6, 2008

(65) Prior Publication Data
US 2009/0273366 A1    Nov. 5, 2009

(30) Foreign Application Priority Data

Apr. 17, 2007 (JP) ................................. 2007-107934

(51) Int. Cl.
*H03K 19/173* (2006.01)
(52) U.S. Cl. ................ 326/38; 326/40; 326/41; 326/47; 326/93; 326/95; 713/100; 713/320
(58) Field of Classification Search ............... 326/37–41, 326/47, 93–98; 713/100, 320, 300, 321–324, 713/330, 340; 716/4, 16
See application file for complete search history.

(56) References Cited

U.S. PATENT DOCUMENTS

| 5,537,057 | A | 7/1996 | Leong et al. |
| 6,396,307 | B1 | 5/2002 | Kawakami et al. |
| 6,703,859 | B2 | 3/2004 | Kumamoto |
| 7,330,985 | B2 * | 2/2008 | Ohneda et al. ............... 713/320 |
| 7,336,116 | B2 | 2/2008 | Hirata et al. |
| 2003/0107400 | A1 | 6/2003 | Kumamoto |

FOREIGN PATENT DOCUMENTS

JP    2001-36020    2/2001

(Continued)

OTHER PUBLICATIONS

International Search Report issued Jul. 15, 2008 in the International (PCT) Application of which the present application is the U.S. National Stage.

(Continued)

*Primary Examiner* — Shawki S Ismail
*Assistant Examiner* — Christopher Lo
(74) *Attorney, Agent, or Firm* — Wenderoth, Lind & Ponack, L.L.P.

(57) ABSTRACT

A semiconductor integrated circuit judges whether a power unit is performing a discharge operation or a charge operation. To reduce clock skew between a plurality of logic blocks in the semiconductor integrated circuit, when the power unit is performing the charge operation, the semiconductor integrated circuit determines a logic block that needs to be operated for the execution of a target process, as an operation block whose operation is to be started, and, determines, in the rest of the logic blocks, a logic block having a termination rate whose value is larger than a value of the minimum termination rate, as the operation block whose operation is to be started, the value of the termination rate being larger by more than a predetermined value.

15 Claims, 21 Drawing Sheets

FOREIGN PATENT DOCUMENTS

| | | |
|---|---|---|
| JP | 2003-174358 | 6/2003 |
| JP | 2005-167779 | 6/2005 |
| JP | 2006-211494 | 8/2006 |

OTHER PUBLICATIONS

Supplementary European Search Report issued Jun. 30, 2011 in European Application No. 08 73 8599.3.

* cited by examiner

FIG. 2

| BLOCK | NUMBER OF OPERATION CLOCKS | OPERATION/ TERMINATION STATE |
|---|---|---|
| WHOLE | 10000 | — |
| BLOCK A | 8000 | OPERATION STATE |
| BLOCK B | 9000 | TERMINATION STATE |
| BLOCK C | 8000 | TERMINATION STATE |
| BLOCK D | 9000 | TERMINATION STATE |

FIG. 14

| BLOCK | DETERIORATION DEGREE | OPERATION/ TERMINATION STATE |
|---|---|---|
| BLOCK A | 8 | OPERATION STATE |
| BLOCK B | 15 | POWER CUTOFF TERMINATION STATE |
| BLOCK C | 11 | LOW LEVEL FIXED TERMINATION STATE |
| BLOCK D | 3 | HIGH LEVEL FIXED TERMINATION STATE |

FIG. 20
(a)
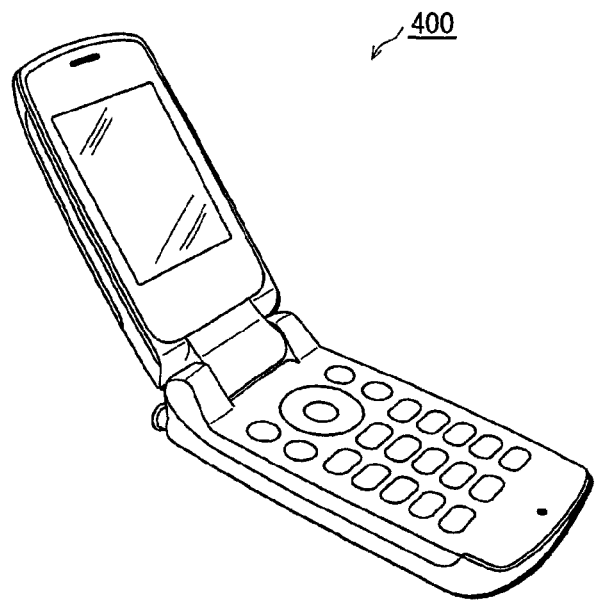
(b)
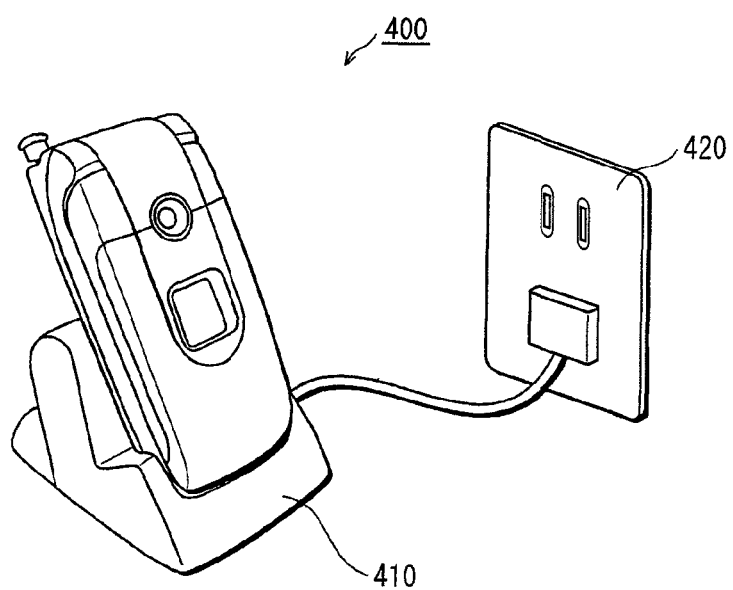

SEMICONDUCTOR INTEGRATED CIRCUIT, SEMICONDUCTOR INTEGRATED CIRCUIT CONTROL METHOD, AND TERMINAL SYSTEM

BACKGROUND OF THE INVENTION (1) Field of the Invention

The present invention relates to a technique for preventing an increase of clock skew caused by the deterioration of a plurality of logic blocks over time.

(2) Description of Related Art

In a synchronous design method that has been popularly used in an LSI (Large Scale Integration) design in recent years, a clock signal for control is supplied to, for example, state registers, at the same timing. In an actual LSI, the amount of delay of the clock signal caused between a clock generation source and a register is different between each of the registers, depending on a difference in the configuration of a clock supply circuit. Note that the difference of the amount of delay between devices such as the registers is referred to as clock skew.

When more than a predetermined amount of the clock skew occurs, an error occurs, for example, in the transmission and reception of data between the registers, resulting in the LSI failing to operate properly. Therefore, in general, when more than a predetermined amount of clock skew occurs, a delay device for balancing the clock skew between the registers is inserted upon designing, so as to avoid the operation failure of the LSI that is caused by the clock skew.

Also provided is a technique for preventing the occurrence of the clock skew by providing the LSI with (i) a clock line that is for supplying a clock signal to logic blocks, and that is independent from a line connecting the logic blocks, and (ii) a clock control unit for dynamically switching between the supply and cutoff of the clock signal to/from each of the logic blocks (see Patent Document 1, for example).

However, transistors included in the LSI, especially a P-channel MOS transistor, deteriorate over time due to NBTI (Negative Bias Temperature Instability), HCI (Hot Carrier Injection) and such. Assume here that a gated clock technique, a power cutoff technique, or the like, is applied to the LSI, so as to save the power consumed by the LSI. In this case, when the LSI continues to be used, the operation time of each transistor becomes different, and the deterioration degree of each transistor also becomes different due to NBTI and HCI. A difference in deterioration degree is a cause for the occurrence of the clock skew. However, the deterioration of transistors over time is not taken into consideration in the above-described technique. Therefore, with the above-described technique, it is impossible to prevent the operation failure of LSIs due to the clock skew that is caused by the deterioration of transistors over time.

As a technique for suppressing the clock skew caused by the deterioration of transistors over time, a technique is proposed that is for equalizing the deterioration of transistors over time, by controlling the termination of the operation of a flip flop. This control is performed by appropriately selecting (i) a case where the control is performed by fixing the control clock signal to a high level, and (ii) a case where the control is performed by fixing the control clock signal to a low level (see Patent Document 2, for example).

Patent Document 1: Japanese Patent Application Publication No. 2003-174358 (Page 10, FIG. 1); and Patent Document 2: Japanese Patent Application Publication No. 2006-211494 (Page 18, FIG. 1).

BRIEF SUMMARY OF THE INVENTION

The technique for suppressing the clock skew described above cannot be applied to the power cutoff technique for reducing the power consumed by LSIs.

However, a mobile terminal, such as a mobile phone, that includes a semiconductor integrated circuit such as an LSI generally operates by receiving a power supply from a storage battery. Therefore, it is preferable to reduce the amount of power consumption, in terms of the operation time of the mobile terminal. This means that the gated clock technique, the power cutoff technique, or the like, is preferably used for the semiconductor integrated circuit.

The object of the present invention is therefore to provide a semiconductor integrated circuit, a method for controlling the same, and a terminal system (i) to which techniques for saving the power consumed by the semiconductor integrated circuit can be applied, and (ii) that reduces the clock skew caused by the deterioration of transistors over time.

Means to Solve the Problems

In order to achieve the above-described object, the present invention provides a semiconductor integrated circuit including a plurality of logic blocks each of which is switchable between a plurality of states pertaining to operation and termination, the semiconductor integrated circuit comprising: an operation acquisition unit operable to acquire operation information indicating an operation of a power unit; a state determination unit operable to determine a state of each of the logic blocks, based on operation/termination information pertaining to a past state of each logic block, when the operation information indicates a predetermined operation in which power saving is unnecessary; and a state control unit operable to control each logic block so that each logic block enters the state determined by the state determination unit.

Also, the present invention provides a method for controlling a semiconductor integrated circuit including a plurality of logic blocks each of which is switchable between a plurality of states pertaining to operation and termination, the control method being performed in the semiconductor integrated circuit and comprising the steps of: acquiring operation information indicating an operation of a power unit; determining a state of each of the logic blocks, based on operation/termination information pertaining to a past state of each logic block, when the operation information indicates a predetermined operation in which power saving is unnecessary; and controlling each logic block so that each logic block enters the state determined by the state determination unit.

Furthermore, the present invention provides a terminal system including a power unit and a semiconductor integrated circuit including a plurality of logic blocks each of which is switchable between a plurality of states pertaining to operation and termination, wherein the semiconductor integrated circuit comprises: an operation acquisition unit operable to acquire operation information indicating an operation of a power unit; a state determination unit operable to determine a state of each of the logic blocks, based on operation/termination information pertaining to a past state of each logic block, when the operation information indicates a predetermined operation in which power saving is unnecessary; and a state control unit operable to control each logic block so that each logic block enters the state determined by the state determination unit.

Effects of the Invention

According to each of the semiconductor integrated circuit, the method for controlling the same, and the terminal system, the logic blocks are controlled such that each of the logic blocks enter a corresponding one of states which include an operation state and a termination state, depending on the past state of each logic block, while the power unit that supplies power to the semiconductor integrated circuit is performing an operation in which power saving is unnecessary. Here, the operation state is a state in which the logic blocks are in operation, and the termination state is a state in which the logic blocks are not in operation. Therefore, a difference of the deterioration degree is small between the logic blocks during a period in which power saving is unnecessary, resulting in the clock skew between the logic blocks being reduced.

In the above-described semiconductor integrated circuit, the predetermined operation may be a charge operation of the power unit.

When the power unit is in the charge operation, power may be supplied from, for example, a commercial power source. Therefore, the clock skew is reduced during the period in which power saving is unnecessary in terms of the operation time.

In the above-described semiconductor integrated circuit, when the operation information indicates a discharge operation of the power unit in which power saving is necessary, the state determination unit may further determine a state of each logic block that needs to be operated for an execution of a target process, as an operation state in which each logic block is in operation.

When the power unit is performing the discharge operation, the semiconductor integrated circuit preferably performs an operation in which power saving is necessary in terms of the operation time.

The stated structure meets the above-described demand, since only a logic block that needs to be operated for the execution of a target process by the semiconductor integrated circuit is operated, when the power unit is performing the discharge operation.

In the above-described semiconductor integrated circuit, the operation/termination information of each logic block is a termination rate of each logic block, the termination rate being a rate of each block having stopped operating in the past, and the state determination unit may determine the state of each logic block, based on the termination rate of each logic block.

According to the above-described structure, the length of a total of periods of each logic block in which the logic block is not in operation, in other words, the length of a total of periods of each logic block in which the logic block is in operation, becomes close to each other, thereby reducing the clock skew between the logic blocks.

In the above-described semiconductor integrated circuit, the state determination unit may specify a minimum termination rate between the termination rates of the logic blocks, and determine a state of each logic block having a termination rate whose value is larger than the minimum termination rate by a value determined in accordance with a predetermined method.

According to the above-described structure, the length of a total of periods of each logic block in which the logic block is not in operation, in other words, the length of a total of periods of each logic block in which the logic block is in operation, becomes close to each other, thereby reducing the clock skew between the logic blocks.

In the above-described semiconductor integrated circuit, each of the states pertaining to operation and termination has a different deterioration degree from each other, and the state determination unit may specify the deterioration degree of each of the logic blocks based on the operation/termination information of each logic block, and determine a state of each logic block such that the larger the deterioration degree is, the smaller a state of the deterioration degree is, based on the specified deterioration degree of each logic block.

According to the above-described structure, the deterioration degree of each of the logic blocks becomes close to each other, thereby reducing the clock skew between the logic blocks.

BRIEF DESCRIPTION OF THE DRAWINGS

FIG. 2 shows an example of a content held by an operation amount holding unit;

FIG. 14 shows one example of a content held by a deterioration degree holding unit shown in FIG. 11;

FIG. 20 is a perspective diagram for explaining the operation of a mobile telephone according to a fourth embodiment.

Figure 1:
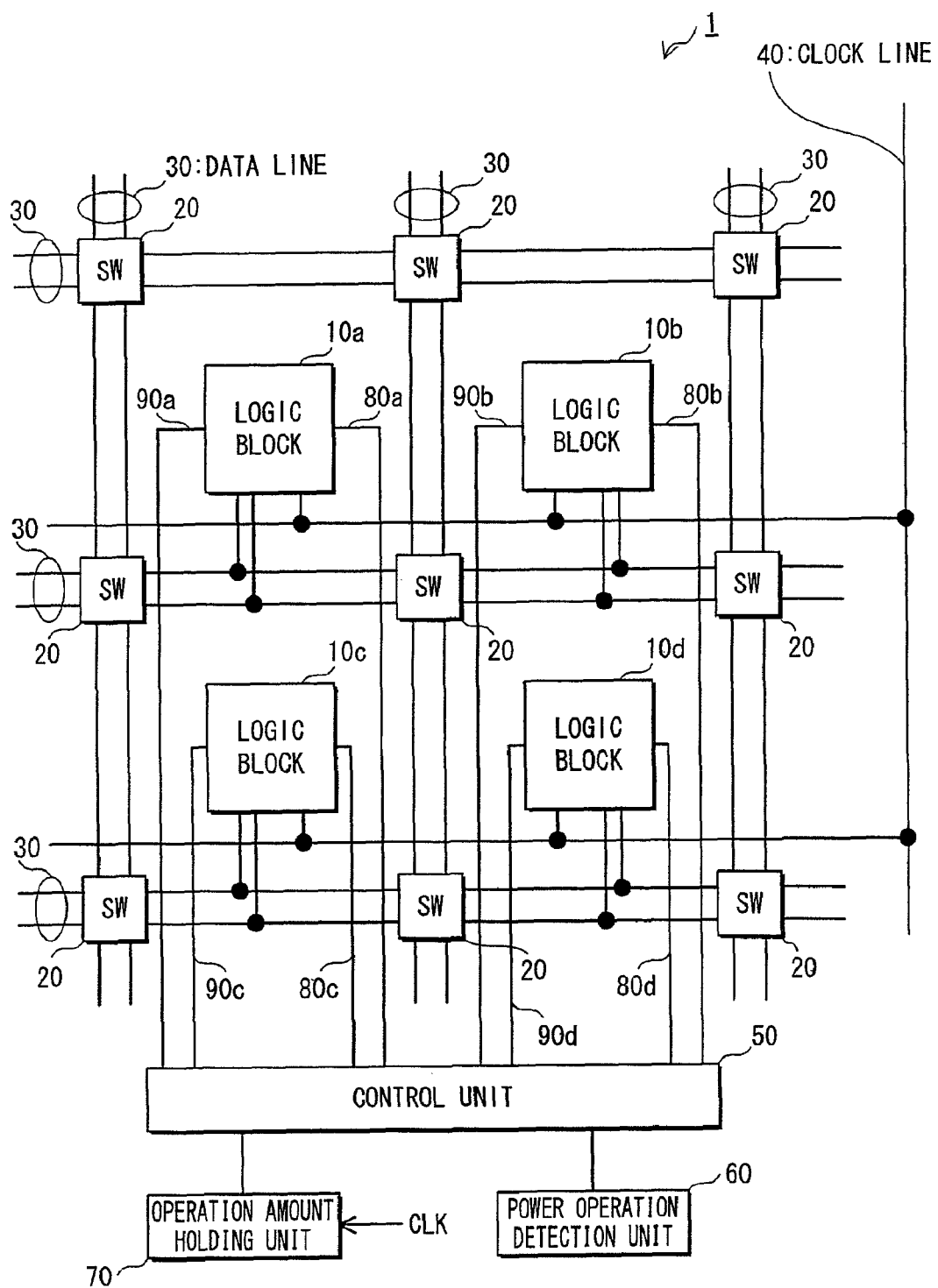
FIG. 1 shows the overall configuration of a semiconductor integrated circuit according to a first embodiment.

DESCRIPTION OF THE REFERENCE CHARACTERS 1 semiconductor integrated circuit
10a to 10d logic blocks
11 logic device 12 clock gate circuit
13a and 13b inverter circuit
50 control unit
51 power operation judgment unit
52 discharge operation processing unit
53 charge operation processing unit
54 state control unit
60 power operation detection unit
70 operation amount holding unit

DETAILED DESCRIPTION OF THE INVENTION

First Embodiment

The following describes a first embodiment of the present invention, with reference to the drawings.

<Configuration>

The following describes the configuration of a semiconductor circuit according to the present embodiment, with reference to FIG. 1. FIG. 1 shows the configuration of the semiconductor integrated circuit according to the present embodiment. Here, the semiconductor integrated circuit may be a programmable logic circuit whose functions are changeable by a program such as an FPGA (Field Programmable Gate Array), reconfigurable logic, or the like.

In FIG. 1, a semiconductor integrated circuit 1 includes logic blocks 10a to 10d, a data line 30, and a line selector 20. The data line 30 is for transmitting and receiving data between each of the logic blocks 10a to 10d, and the line selector 20 is for changing the setting of the connection state of the data line 30 between each of the logic blocks 10a to 10d, depending on a program.

The semiconductor integrated circuit 1 further includes a clock generation circuit and a clock line 40. The clock generation circuit is not shown in figures, and provided for supplying a clock signal to each of the logic blocks 10a to 10d, and the clock line 40 is for connecting the logic blocks 10a to 10d.

The semiconductor integrated circuit 1 further includes a control unit 50, state control lines 80a to 80d, and configuration control lines 90a to 90d. The control unit 50 uses the state control lines 80a to 80d for a switching control for switching a plurality of states pertaining to the operation and termination of each of the logic blocks 10a to 10d, and uses the configuration control lines 90a to 90d for the switching control of the configuration of the semiconductor integrated circuit 1. Note that in the present embodiment, the states pertaining to the operation and termination of each of the logic blocks 10a to 10d (hereinafter referred to as operation/termination state) include a state where the logic blocks 10a to 10d are in operation (hereinafter referred to as "operation state"), and a state where the logic blocks 10a to 10d terminate the operation (hereinafter referred to as "termination state").

The control unit 50 performs a process for determining the configuration of the semiconductor integrated circuit 1, and also a process for determining the operation/termination state (the operation state and the termination state) that controls the logic blocks 10a to 10d. The control unit 50 also performs the switching control of the line selector 20, so that the logic blocks 10a to 10d are in a connection state suitable for realizing a target process of the semiconductor integrated circuit 1.

The semiconductor integrated circuit 1 further includes a power operation detection unit 60. The power operation detection unit 60 detects the operation (one of a discharge operation and a charge operation) of a power unit (battery, for example), and outputs, to the control unit 50, a power operation notification signal for notifying the detected operation of the power unit.

The semiconductor integrated circuit 1 further includes an operation amount holding unit 70.

The operation amount holding unit 70 measures the number of rising edges or falling edges (the number of clocks) of the clock signal CLK oscillated by an oscillation circuit that is not shown.

The operation amount holding unit 70 holds a storage table for storing the number of operation clocks of the semiconductor integrated circuit 1, the number of operation clocks of each of the logic blocks 10a to 10d, and the operation/termination state of each of the logic blocks 10a to 10d. FIG. 2 shows one example of the storage table. Note here that the number of operation clocks held by the operation amount holding unit 70 is the number of clocks of the clock signals CLK during a period in which the semiconductor integrated circuit 1 and the logic blocks 10a to 10d are operating (for example, in a case where the current configuration is a configuration a, and a configuration immediately before the configuration a is a configuration b, the period is an operation period that continues until the configuration b is finished).

In FIG. 2, "whole" in the field "block" indicates the entirety of the semiconductor integrated circuit 1, and "block A", "block B", "block C", and "block D" denote the logic blocks 10a, 10b, 10c, and 10d, respectively. For example, if the current configuration of the semiconductor integrated circuit 1 is the configuration a, and the configuration thereof immediately before the configuration a is the configuration b, the field "number of operation clocks" stores the number of operation clocks at a time when the configuration b is finished, and the field "operation/termination state" stores the operation/termination state (operation state or termination state) of each of the logic blocks 10a to 10d when the configuration of the semiconductor integrated circuit is the configuration a.

(Configuration of Logic Block)

Figure 3:
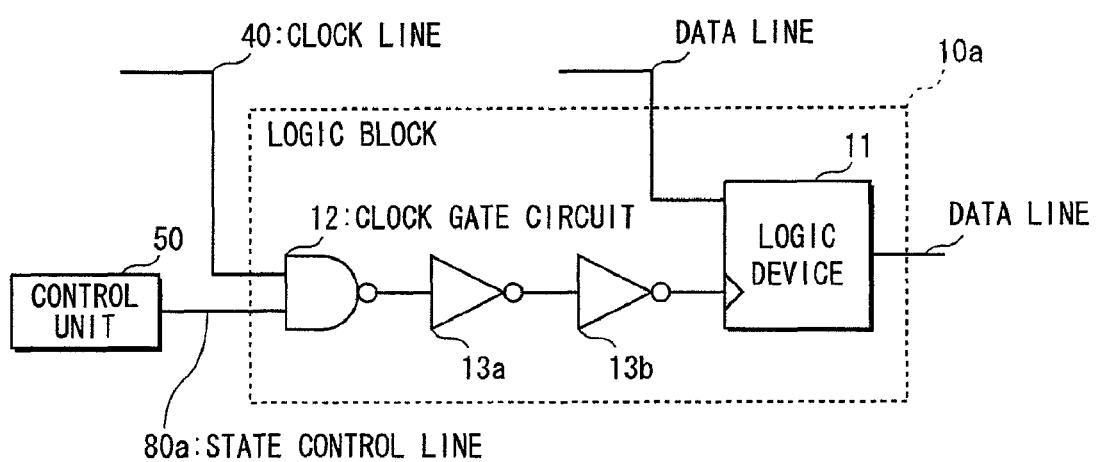
FIG. 3 shows the configuration of a logic block shown in FIG. 1.

The following describes the configuration of the logic block 10a shown in FIG. 1, with reference to FIG. 3. FIG. 3 shows the configuration of the logic block 10a shown in FIG. 1. Note that the configuration control line 90a is not shown in FIG. 3. Also, the logic block 10a includes one or more logic devices 11, although FIG. 3 only shows one logic device 11. Note that parts of the logic blocks 10b to 10d pertaining to the present invention have a substantially same configuration as the corresponding parts of the logic block 10a.

The logic block 10a performs a logic operation process, and includes the logic device 11, a clock gate circuit 12, an inverter circuits 13a and 13b.

The logic device 11 is, for example, a flip flop that operates in synchronization with a clock signal input into a control terminal.

Each of the inverter circuits 13a and 13b outputs, as an output signal, a signal obtained by inverting the signal level of an input signal. Note here that each of the inverter circuits 13a and 13b is a CMOS inverter circuit including a P-channel MOS transistor (hereinafter referred to as "PMOS transistor") and an N-channel MOS transistor (hereinafter referred to as "NMOS transistor"). Note that the number of inverter circuits provided between the clock gate circuit 12 and the logic device 11 is not limited to two as shown in FIG. 3 as the inverter circuits 13a and 13b.

The clock gate circuit 12 is composed of NAND circuits, and two input terminals of the clock gate circuit 12 are connected to a clock line 40 and a state control line 80a, respectively. When the level of a control signal in the state control line 80a is high, an output signal from the clock gate circuit 12 is a clock signal obtained by inverting the level of a clock signal that is supplied from the clock line 40 to the clock gate circuit 12. When the level of the control signal in the state control line 80a is low, the output signal from the clock gate circuit 12 is a clock signal fixed to a high level.

The clock signal output from the clock gate circuit 12 passes the inverter circuits 13a and 13b, and the clock signal output from the inverter circuit 13b is input to a control terminal of the logic device 11.

In the logic block 10a having the above-described structure, the control unit 50 causes the level of the control signal in the state control line 80a to be high, whereby a clock signal that alternates between high and low levels is input to the control terminal of the logic device 11. Consequently, the logic device 11 starts operating, and the logic block 10a enters the operation state.

Also, the control unit 50 causes the level of the control signal in the state control line 80a to be low, whereby a clock signal fixed to a high level is input to the control terminal of the logic device 11. Consequently, the logic device 11 does not start operating, and the logic block 10a enters the termination state.

Note that the above-described explanation can also be applied to the logic blocks 10b to 10d.

(Configuration of Control Unit)

Figure 4:
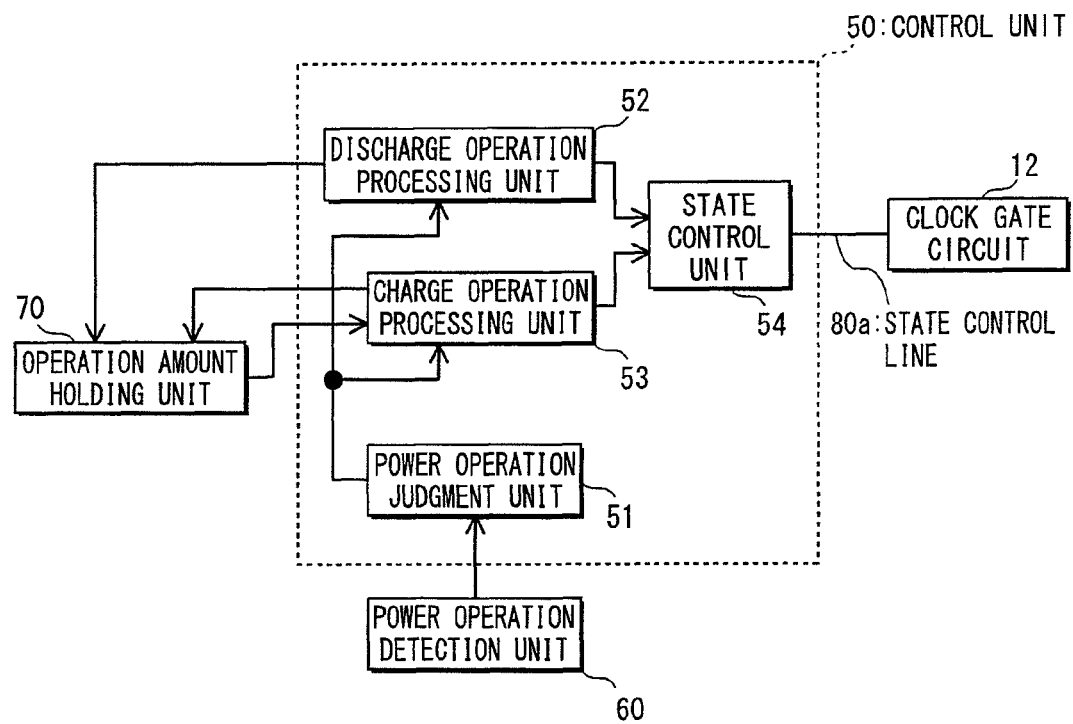
FIG. 4 shows the configuration of a control unit shown in FIG. 1.

The following describes the configuration of the control unit 50 shown in FIG. 1, with reference to FIG. 4. FIG. 4 shows the configuration of the control unit 50 shown in FIG. 1. Note that FIG. 4 only shows the clock gate circuit 12 of the logic block 10a, and not the clock gate circuits of the other logic blocks 10b to 10d.

The control unit 50 includes a power operation judgment unit 51, a discharge operation processing unit 52, a charge operation processing unit 53, and a state control unit 54.

The power operation judgment unit 51 judges whether the operation of the power unit is the charge operation or the discharge operation, based on the power operation notification signal input from the power operation detection unit 60, at the timing of the semiconductor integrated circuit 1 switching the configuration. When judging that the operation of the power unit is the discharge operation, the power operation judgment unit 51 outputs, to the discharge operation processing unit 52, an instruction signal for a discharge operation process. When judging that the operation of the power unit is the charge operation, the power operation judgment unit 51 outputs, to the charge operation processing unit 53, an instruction signal for a charge operation process.

Upon receipt of the instruction signal for the discharge operation process from the power operation judgment unit 51, the discharge operation processing unit 52 adds the number of clocks measured by the operation amount holding unit 70 respectively to (i) the number of operation clocks corresponding to the entirety of the semiconductor integrated circuit 1 and (ii) the number of operation clocks corresponding to one or more logic blocks whose field "operation/termination state" has stored therein the "operation state", in the storage table shown in FIG. 2 held by the operation amount holding unit 70. In this way, when the configuration of the semiconductor integrated circuit 1 is switched, for example, from the configuration b to the configuration a, each of the number of operation clocks that is of the respective one of the semiconductor integrated circuit 1 and the logic blocks 10a to 10d and of when the configuration b is finished is stored in the field "the number of operation clocks" in the storage table shown in FIG. 2. Then, the discharge operation processing unit 52 resets the number of clocks that is being measured by the operation amount holding unit 70 to "0".

Furthermore, the discharge operation processing unit 52 determines, between the logic blocks 10a to 10d, a logic block that needs to be operated for the execution of a process that is to be performed by the semiconductor integrated circuit 1, as an operation block whose operation is to be started. Then, the discharge operation processing unit 52 determines the rest of the logic blocks as termination blocks whose operations are to be terminated. Then, the discharge operation process unit 52 outputs, to the state control unit 54, a first state notification signal that includes information indicating the operation block and termination blocks. Also, the discharge operation processing unit 52 stores, in the storage table shown in FIG. 2, "operation state" in the field "operation/termination state" corresponding to the logic block determined as the operation block, and "termination state" in the field "operation/termination state" corresponding to the logic blocks determined as the termination blocks.

Upon receipt of the instruction signal for the charge operation process from the power operation judgment unit 51, the charge operation processing unit 53 adds the number of clocks measured by the operation amount holding unit 70 respectively to (i) the number of operation clocks corresponding to the entirety of the semiconductor integrated circuit 1 and (ii) the number of operation clocks corresponding to one or more logic blocks whose field "operation/termination state" has stored therein the "operation state", in the storage table shown in FIG. 2 held by the operation amount holding unit 70. Then, the charge operation processing unit 53 resets the number of clocks that is being measured by the operation amount holding unit 70 to "0".

Furthermore, the charge operation processing unit 53 determines, between the logic blocks 10a to 10d, a logic block that needs to be operated for the execution of a process that is to be performed by the semiconductor integrated circuit 1, as an operation block whose operation is to be started. Furthermore, the charge operation processing unit 53 determines each of the logic blocks other than the logic block that has been determined as the operation block, as either the operation block or the termination block, based on the number of operation clocks in the storage table shown in FIG. 2 after the number of clocks has been added to the table by the charge operation processing unit 53. Then, the charge operation processing unit 53 outputs, to the state control unit 54, a second state notification signal that includes information indicating the operation block and termination block. Also, the charge operation processing unit 53 stores, in the storage table shown in FIG. 2, "operation state" in the field "operation/termination state" corresponding to the logic block determined as the operation block, and "termination state" in the field "operation/termination state" corresponding to the logic block determined as the termination block.

The state control unit 54 sets, to a high level, the level of a control signal in a state control line corresponding to the operation block that is included in the first state notification signal, which is input from the discharge operation processing unit 52, and sets, to a low level, the level of each control signal in the respective state control lines corresponding to the rest of the logic blocks. Also, the state control unit 54 sets, to a high level, the level of a control signal in a state control line corresponding to the operation block that is included in the second state notification signal, which is input from the charge operation processing unit 53, and sets, to a low level, the level of each control signal in the respective state control lines corresponding to the rest of the logic blocks.

<Operation>

Figure 5:
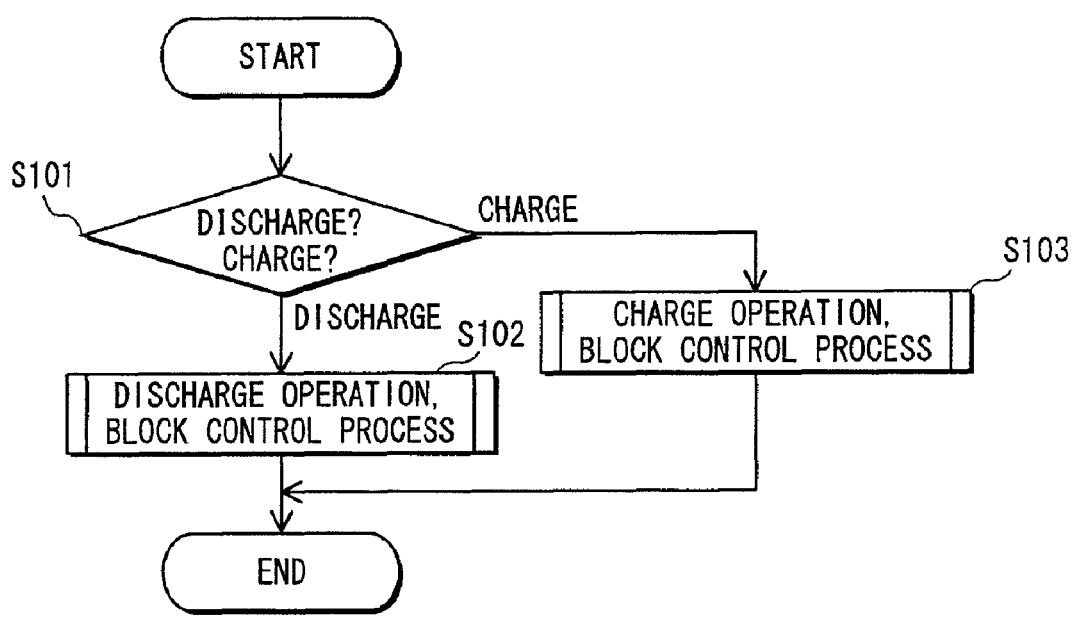
FIG. 5 is a flowchart showing the steps of a logic block control process performed by the semiconductor integrated circuit shown in FIG. 1.

The following describes the operation of the semiconductor integrated circuit 1 with reference to FIG. 5, whose configuration has been described with reference to FIGS. 1 to 4. FIG. 5 is a flowchart showing the steps of a logic block control process performed by the semiconductor integrated circuit 1 shown in FIG. 1.

The power operation judgment unit 51 judges whether the operation of the power unit is the discharge operation or the charge operation, based on the power operation notification signal input from the power operation detection unit 60, at the timing of switching the configuration of the semiconductor integrated circuit 1 (step S101).

Figure 6:
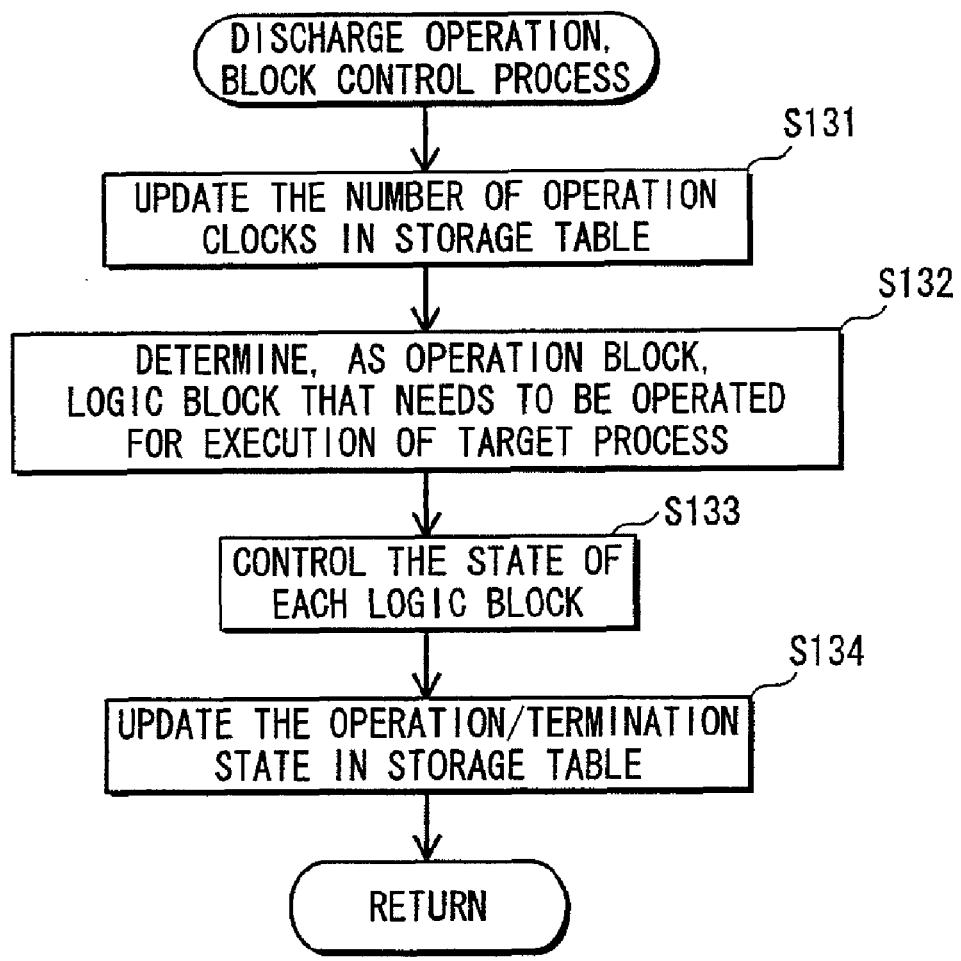
FIG. 6 is a flowchart showing the steps of a discharge-operation block control process shown in FIG. 5.
Figure 7:
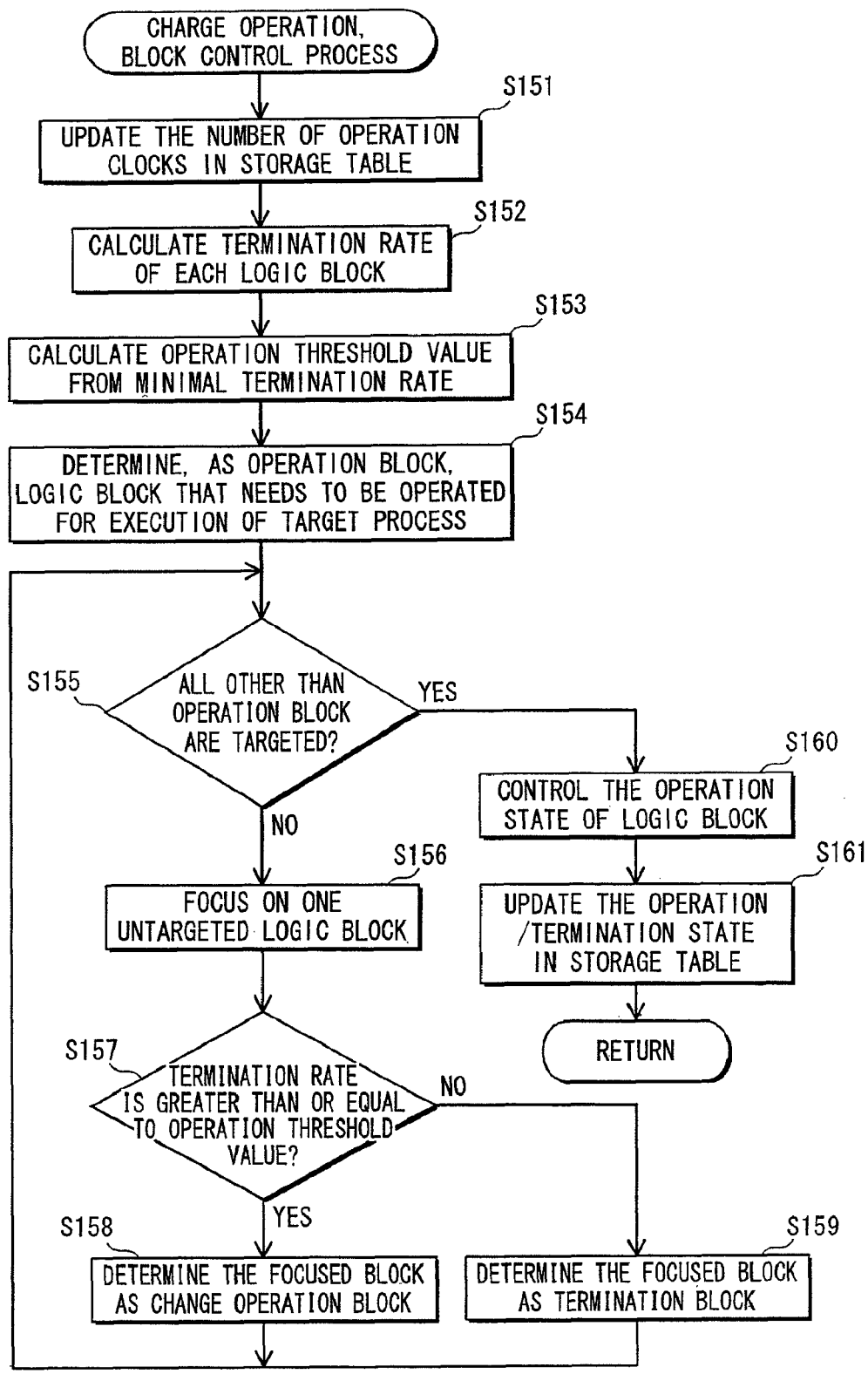
FIG. 7 is a flowchart showing the steps of a charge-operation block control process shown in FIG. 5.

When the operation of the power unit is judged to be the discharge operation by the power operation judgment unit 51 (S101: discharge), the discharge operation processing unit 52 and the state control unit 54 perform a discharge-operation block control process whose steps are shown in FIG. 6 (step S102). When the operation of the power unit is judged to be the charge operation by the power operation judgment unit 51 (S101: charge), the charge operation processing unit 53 and the state control unit 54 perform a charge-operation block control process whose steps are shown in FIG. 7 (step S103).

(Discharge-Operation Block Control Process)

The following describes the discharge-operation block control process (step S102) shown in FIG. 5, with reference to FIG. 6. FIG. 6 is a flowchart showing the steps of the discharge-operation block control process (step S102) shown in FIG. 5.

The discharge operation processing unit 52 updates a content stored by the storage table by adding the numbers of clocks measured by the operation amount holding unit 70 respectively to (i) the number of operation clocks corresponding to the entirety of the semiconductor integrated circuit 1 and (ii) the number of operation clocks corresponding to one or more logic blocks whose field "operation/termination state" has stored therein the "operation state", in the storage table shown in FIG. 2. Then, the discharge operation processing unit 52 resets the number of clocks that is being measured by the operation amount holding unit 70 to "0" (step S131).

The discharge operation processing unit 52 determines, as the operation block that is a logic block whose operation is to be started, a logic block that needs to be operated for the execution of a process that is to be performed (target process) by the semiconductor integrated circuit 1, and also determines, as the termination blocks that are logic blocks whose operations are to be terminated, logic blocks other than the logic block determined to be the operation block (step S132).

The state control unit 54 sets, to a high level, the level of a control signal in a state control line corresponding to a logic block determined as the operation block in step S132, and sets, to a low level, the level of the control signal in the state control lines corresponding to the logic blocks determined as the termination blocks (step S133).

The discharge operation processing unit 52 stores, in the storage table shown in FIG. 2, "operation state" in the field "operation/termination state" corresponding to the logic block determined as the operation block in step S132, and "termination state" in the field "operation/termination state" corresponding to the logic blocks determined as the termination blocks (step S134). Then, the control unit 50 returns to the process shown in FIG. 5.

(Charge-Operation Block Control Process)

The following describes the charge-operation block control process (step S103) shown in FIG. 5, with reference to FIG. 7. FIG. 7 is a flowchart showing the steps of the charge-operation block control process (step S103) shown in FIG. 5.

The charge operation processing unit 53 updates a content stored in the storage table, by adding the numbers of clocks measured by the operation amount holding unit 70 respectively to (i) the number of operation clocks corresponding to the entirety of the semiconductor integrated circuit 1 and (ii) the number of operation clocks corresponding to one or more logic blocks whose field "operation/termination state" has stored therein the "operation state", in the storage table shown in FIG. 2. Then, the charge operation processing unit 53 resets the number of clocks that is being measured by the operation amount holding unit 70 to "0" (step S151).

The charge operation processing unit 53 subtracts, for each of the logic blocks 10a to 10d, the number of operation clocks of the logic block from the number of operation clocks of the entirety of the semiconductor integrated circuit 1, so as to obtain a subtraction value, by referring to the operation clocks in the storage table after the number of operation clocks measured by the operation amount holding unit 70 has been added in the above-described step. Then, the charge operation processing unit 53 divides the subtraction value by the number of operation clocks of the entirety of the semiconductor integrated circuit 1, so as to obtain a division value, and sets the division value as the termination rate of the logic block (step S152). Subsequently, the charge operation processing unit 53 specifies the minimal termination rate between the termination rates of the respective logic blocks 10a to 10d, adds a predetermined value to the minimal termination rate that has been specified, so as to obtain an addition value, and sets the addition value as an operation threshold value (step S153).

The charge operation processing unit 53 determines a logic block that needs to be operated for the execution of a process that is to be performed (target process) by the semiconductor integrated circuit 1, as an operation block that is a logic block whose operation is to be started (step S154).

The charge operation processing unit 53 judges whether all logic blocks other than the operation block have been targeted for the process of steps S156 to S159 described below (step S155).

When judging that all logic blocks other than the operation block have not been targeted for the process (S155: NO), the charge operation processing unit 53 focuses on one of the logic blocks that have not been targeted for the process (step S156). Then, the charge operation processing unit 53 judges whether the termination rate of the focused logic block is greater than or equal to the operation threshold value (step S157).

When judging that the termination rate of the focused logic block is greater than or equal to the operation threshold value (S157: YES), the charge operation processing unit 53 determines the focused logic block as a logic block whose operation is to be started (hereinafter referred to as "change operation block") (step S158), and proceeds to the process of step S155. When judging that the termination rate of the focused logic block is not greater than or equal to the operation threshold value (S157: NO), the charge operation processing unit 53 determines the focused logic block as a logic block whose operation is to be terminated (hereinafter referred to as "termination block") (step S159), and proceeds to the process of step S155.

When all logic blocks other than the operation block are judged to have been targeted for the process by the charge operation processing unit 53 (S155: YES), the state control unit 54 sets, to a high level, (i) the level of a control signal in a state control line corresponding to the logic block determined as the operation block in step S154, and (ii) the level of a control signal in a state control line corresponding to the logic block determined as the change operation block in step S158. Also, the state control unit 54 sets, to a low level, the level of a control signal in a state control line corresponding to the logic block determined as the termination block in step S159 (step S160).

The charge operation processing unit 53 stores, in the storage table shown in FIG. 2, "operation state" in the field "operation/termination state" corresponding to the logic block determined as one of the operation block and the change operation block, and "termination state" in the field "operation/termination state" corresponding to the logic block determined as the termination block (step S161). Then, the control unit 50 returns to the process shown in FIG. 5.

Specific Example

Figure 8A:
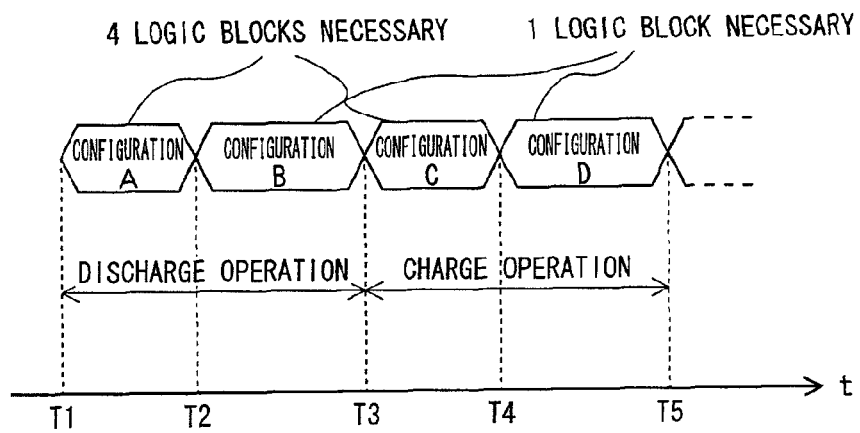
FIGS. 8A and 8B are diagrams for explaining a specific example of the logic block control process performed by the semiconductor integrated circuit shown in FIG. 1.
Figure 8B:
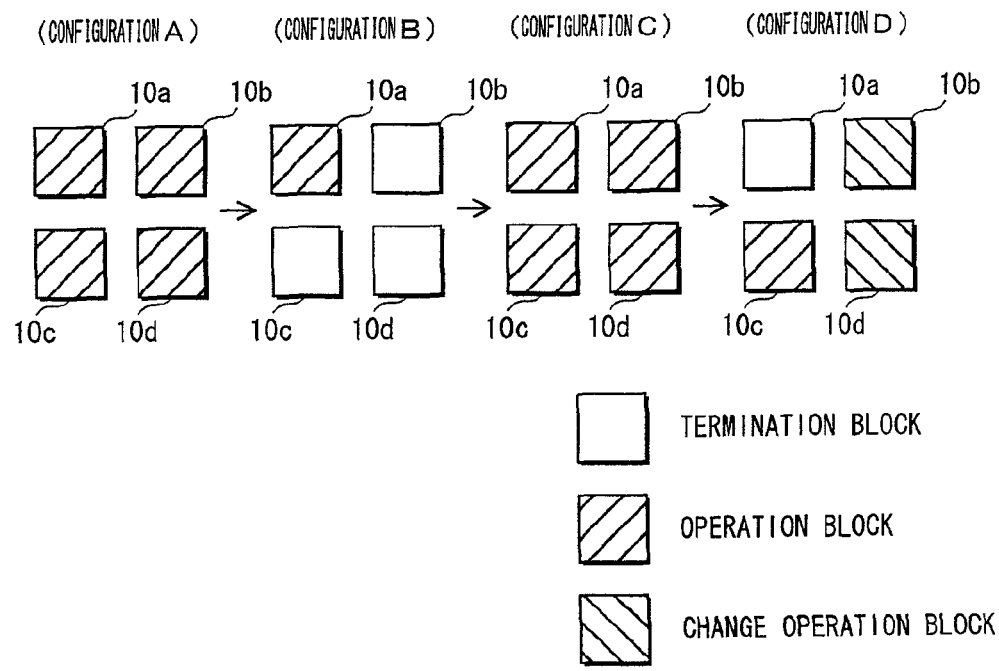

The following describes, with reference to FIGS. 8A and 8B, a specific example of the operation of the semiconductor integrated circuit 1 that has been described with references FIGS. 1 to 7. FIGS. 8A and 8B are each a diagram for explaining a specific example of the logic block control process performed by the semiconductor integrated circuit shown in FIG. 1.

In this specific example, the semiconductor integrated circuit 1 performs operations in order of configurations A, B, C, and D, where in configuration A, logic blocks that need to be operated for the execution of a target process are the logic blocks 10a to 10d; in configuration B, a logic block that needs to be in operation is only the logic block 10a; in configuration C, logic blocks that need to be in operation are 10a to 10d; and in configuration D, a logic block that needs to be in operation is the logic block 10c.

It is assumed that the power unit performs the discharge operation while the semiconductor integrated circuit 1 is performing in the configurations A and B, and the charge operation while the semiconductor integrated circuit 1 is performing in the configurations C and D.

Between the times T1 and T2, the power operation judgment unit 51 judges that the operation of the power unit is the discharge operation. The discharge operation processing unit 52 determines all of the logic blocks 10a to 10d as the operation blocks, and the state control unit 54 generates a control signal for the operation of the logic blocks 10a to 10d (configuration A).

Between the times T2 and T3, the power operation judgment unit 51 judges that the operation of the power unit is the discharge operation. The discharge operation processing unit 52 determines the logic block 10a as the operation block, and the logic blocks 10b to 10d as the termination blocks. The state control unit 54 generates a control signal for the operation of the logic block 10a, and a control signal for the termination of the operation of the logic blocks 10b to 10d (configuration B). Note that the process for determining the operation block between the logic blocks 10b to 10d, based on the termination rate, is not performed between the times T2 and T3, since the power unit is in the discharge operation.

Between the times T3 and T4, the power operation judgment unit 51 judges that the operation of the power unit is the charge operation. The charge operation processing unit 53 determines all of the logic blocks 10a to 10d as the operation blocks, and the state control unit 54 generates a control signal for the operation of the logic blocks 10a to 10d (configuration C). Note that, when the semiconductor integrated circuit 1 switches its configuration from the configuration C to the configuration D, the termination rate of each of the logic blocks 10b to 10d is assumed to be greater than or equal to an addition value (operation threshold value) obtained by adding a predetermined value to the minimal termination rate between the termination rates of the respective logic blocks 10a to 10d, and the termination rate of the logic block 10a is assumed to be less than the operation threshold value.

Between the times T4 to T5, the power operation judgment unit 51 judges that the operation of the power unit is the charge operation. The charge operation processing unit 53 determines the logic block 10c as a logic block whose operation is to be started (operation block). Among the logic blocks 10a, 10b, and 10d excluding the logic block 10c that has been determined to be the operation block, the charge operation processing unit 53 determines (i) the logic blocks 10b and 10d as the logic blocks whose operations are to be started (change operation block) and (ii) the logic block 10a as a logic block whose operation is to be terminated (termination block), based on the termination rate. The state control unit 54 generates a control signal for the operation of each of the logic blocks 10c, 10b, and 10d, and a control signal for the termination of the operation of the logic block 10a (Configuration D).

According to the semiconductor integrated circuit 1 in the present embodiment described above, when the power unit is in the discharge operation, the semiconductor integrated circuit 1 performs a switching control for switching between the operation state and termination state of the logic blocks, so as to operate only a logic block that needs to be operated for the execution of the target process. This makes it possible to save power consumed by the semiconductor integrated circuit 1, when the power unit is in the discharge operation.

Also, in a case where the power unit is in the charge operation where the semiconductor integrated circuit 1 does not need to save power, the semiconductor integrated circuit 1 performs a switching control for switching between the operation state and termination state of each of the logic blocks such that each of the termination rates of the respective logic blocks 10a to 10d, in other words, each of the operation rates of the respective logic blocks 10a to 10d becomes close to each other. This makes it possible to minimize the clock skew between each of the logic blocks, resulting in preventing an error in data transmission and reception between each of the logic blocks due to clock skew caused by the deterioration of the logic blocks over time. Also, the number of delay devices inserted between each of the logic blocks, etc. can be reduced, since the semiconductor integrated circuit 1 can be designed based on smaller clock skew. This makes it possible to save the power consumed by the semiconductor integrated circuit 1, and to prevent an increase in the area of the semiconductor integrated circuit 1.

Second Embodiment

The following describes the second embodiment of the present invention, with reference to the drawings.

Note that, while a gated clock technique is used in the first embodiment, a power cutoff technique is used in the present embodiment. Here, the gated clock technique is for stopping the supply of clocks so as to terminate the operation of the logic blocks, and the power cutoff technique is for stopping the power so as to terminate the operation of the logic blocks.

In the second embodiment, descriptions of components that are substantially the same as the components of the first embodiment are omitted, since the same descriptions as those used in the first embodiment are applicable with use of the same reference numbers as those used in the first embodiment.

<Configuration>

Figure 9:
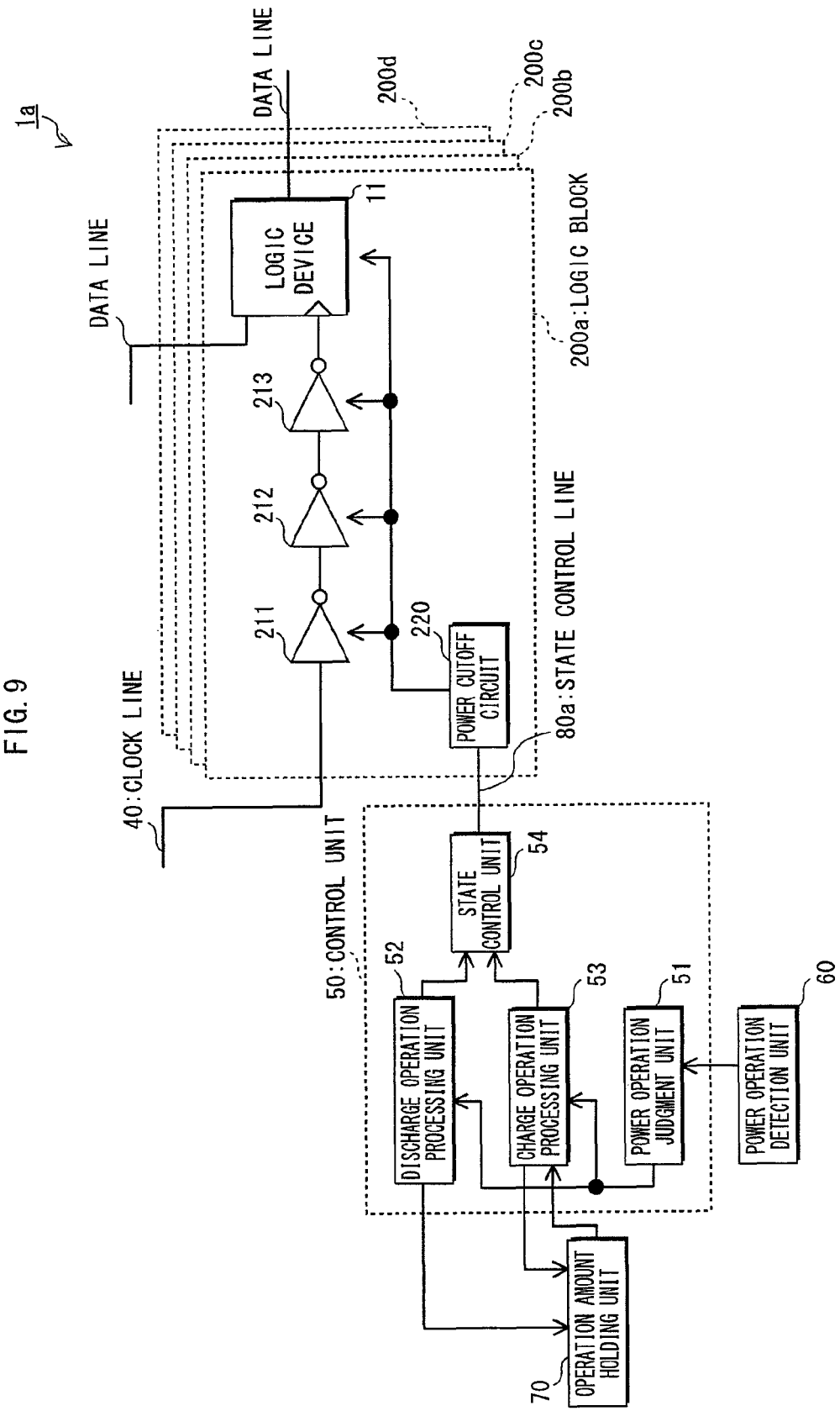
FIG. 9 shows the configuration of a semiconductor integrated circuit according to a second embodiment.

The following describes the configuration of a semiconductor integrated circuit of the present embodiment, with reference to FIG. 9. FIG. 9 shows the configuration of the semiconductor integrated circuit according to the present embodiment.

A semiconductor integrated circuit 1a is different from the semiconductor integrated circuit 1 according to the first embodiment, in that the semiconductor integrated circuit 1a includes different logic blocks from the semiconductor integrated circuit 1, and components of the semiconductor integrated circuit 1a other than the logic blocks are substantially the same as the corresponding components of the semiconductor integrated circuit 1.

(Configuration of Logic Block)

The semiconductor integrated circuit 1a includes logic blocks 200a to 200d. Parts of the logic blocks 200a to 200d pertaining to the present invention have a substantially same configuration.

The logic block 200a performs a logic operation process, and includes the logic device 11, inverter circuits 211 to 213, and a power cutoff circuit 220.

Each of the inverter circuits 211 to 213 outputs, as an output signal, a signal obtained by inverting the signal level of an input signal. An input terminal of the inverter circuit 211 is connected to the clock line 40, and a clock signal input to the input terminal of the inverter circuit 211 passes the inverter circuits 211 to 213, and the clock signal output from the inverter circuit 213 is input to the control terminal of the logic device 11. Note that the number of inverter circuits is not limited to three, as shown in FIG. 9 as the inverter circuits 211, 212, and 213.

When the level of the control signal in the state control line 80a is high, the power cutoff circuit 220 connects the power source to the logic device 11 and the inverter circuits 211 to 213, so as to supply power thereto. When the level of the control signal in the state control line 80a is low, the power cutoff circuit 220 cuts off the power source from the logic device 11 and the inverter circuits 211 to 213, so as to cut power therefrom.

In the logic block 200a having the above-described structure, the control unit 50 causes the level of the control signal in the state control line 80a to be high, so that the power is supplied to the logic device 11 and the inverter circuits 211 to 213. Consequently, the logic device 11 and the inverter circuits 211 to 213 start operating, whereby the logic block 200a enters the operation state. Also, the control unit 50 causes the level of the control signal in the state control line 80a to be low, so that the power is not supplied to the logic device 11 and the inverter circuits 211 to 213. Consequently, the logic device 11 and the inverter circuits 211 to 213 do not operate, whereby the logic block 200a enters the termination state.

Note that the above-described explanation can also be applied to the logic blocks 200b to 200d.

(Configuration of Power Cutoff Circuit)

Figure 10:
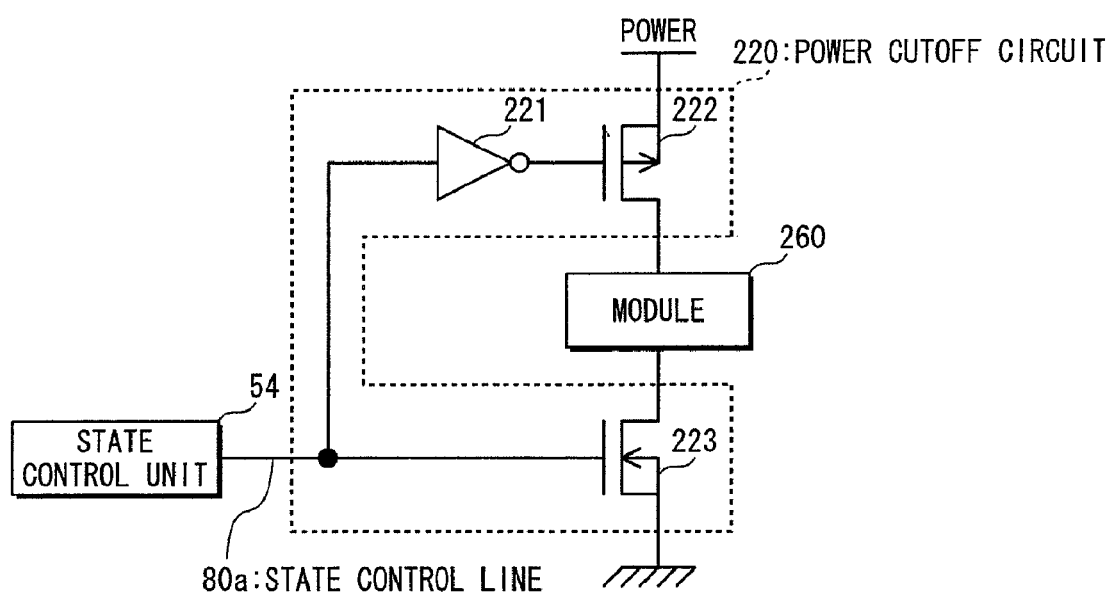
FIG. 10 shows the configuration of a power cutoff circuit shown in FIG. 9.

The following describes the configuration of the power cutoff circuit 220 shown in FIG. 9, with reference to FIG. 10. FIG. 10 shows the configuration of the power cutoff circuit 220 shown in FIG. 9. Note that a module 260 includes the logic device 11 and the inverter circuits 211 to 213 shown in FIG. 9.

The power cutoff circuit 220 includes an inverter circuit 221, a PMOS transistor 222, and an NMOS transistor 223. A source electrode of the PMOS transistor 222 is connected to the power source, and a drain electrode of the PMOS transistor 222 is connected to the module 260. A source electrode of the NMOS transistor 223 is connected to a ground plate, and a drain electrode of the NMOS transistor 223 is connected the module 260.

An input terminal of the inverter circuit 221 and a gate electrode of the NMOS transistor 223 are connected to the state control line 80a, and a gate electrode of the PMOS transistor 222 is connected to an output terminal of the inverter circuit 221.

When the level of the control signal in the state control line 80a is high, a low level signal is applied to the gate electrode of the PMOS transistor 222, and a high level signal is applied to the gate electrode of the NMOS transistor 223. This causes the PMOS transistor 222 and the NMOS transistor 223 to be in an on-state, resulting in the module 260 being connected to the power source and the power being supplied to the module 260.

When the level of the control signal in the state control line 80a is low, a high level signal is applied to the gate electrode of the PMOS transistor 222, and a low level signal is applied to the gate electrode of the NMOS transistor 223. This causes the PMOS transistor 222 and the NMOS transistor 223 to be in an off-state, resulting in the module 260 being cut off from the power source, and the power not being supplied to the module 260.

Third Embodiment

The following describes a semiconductor integrated circuit according to a third embodiment of the present invention, with reference to the drawings.

Note that in the first embodiment, the gated clock technique is used to stop supplying clocks to the logic devices, etc. so as to stop the operation of the logic blocks, and in the second embodiment, the power cutoff technique is used to stop supplying power so as to terminate the operation of the logic blocks. Here in the present embodiment, both of the techniques, namely the gated clock technique and the power cutoff technique are used to stop the operation of the logic blocks.

In the third embodiment, descriptions of components that are substantially the same as the components of the first embodiment are omitted, since the same descriptions as those used in the first embodiment are applicable with use of the same reference numbers as those used in the first embodiment.

<Configuration>

Figure 11:
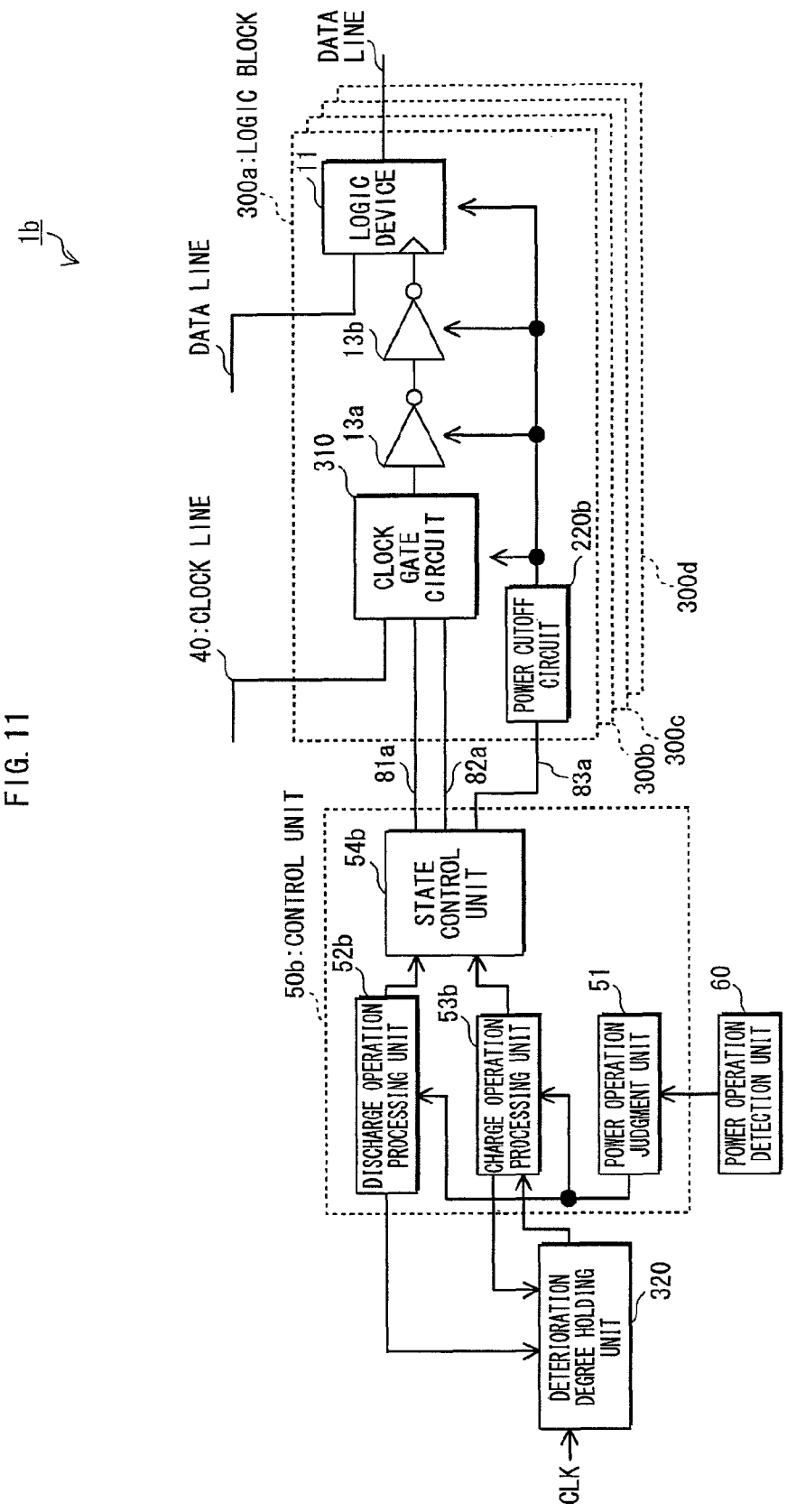
FIG. 11 shows the configuration of a semiconductor integrated circuit according to a third embodiment.

The following describes the configuration of the semiconductor integrated circuit of the present embodiment, with reference to FIG. 11. FIG. 11 shows the configuration of the semiconductor integrated circuit according to the present embodiment.

A semiconductor integrated circuit 1b includes logic blocks 300a to 300d, a control unit 50b, the power operation detection unit 60, a deterioration degree holding unit 320, the clock line 40, and state control lines 81a to 83a. Note that parts of the logic blocks 300a to 300d pertaining to the present invention have a substantially same configuration.

(Configuration of Logic Blocks)

The logic block 300a performs a logic operation process, and includes the logic device 11, a clock gate circuit 310, the inverter circuits 13a and 13b, and a power cutoff circuit 220b.

The power cutoff circuit 220b has the same configuration as the power cutoff circuit 220 whose configuration is shown in FIG. 10. When the level of the control signal in the state control line 83a is high, the power cutoff circuit 220b connects the power source to the logic device 11, the clock gate circuits 310, and the inverter circuits 13a and 13b, so as to supply power thereto. When the level of the control signal in the state control line 83a is low, the power cutoff circuit 220b cuts off the power source from the logic device 11, the clock gate circuit 310, and the inverter circuits 13a and 13b, so as to cut off power therefrom.

Figure 12:
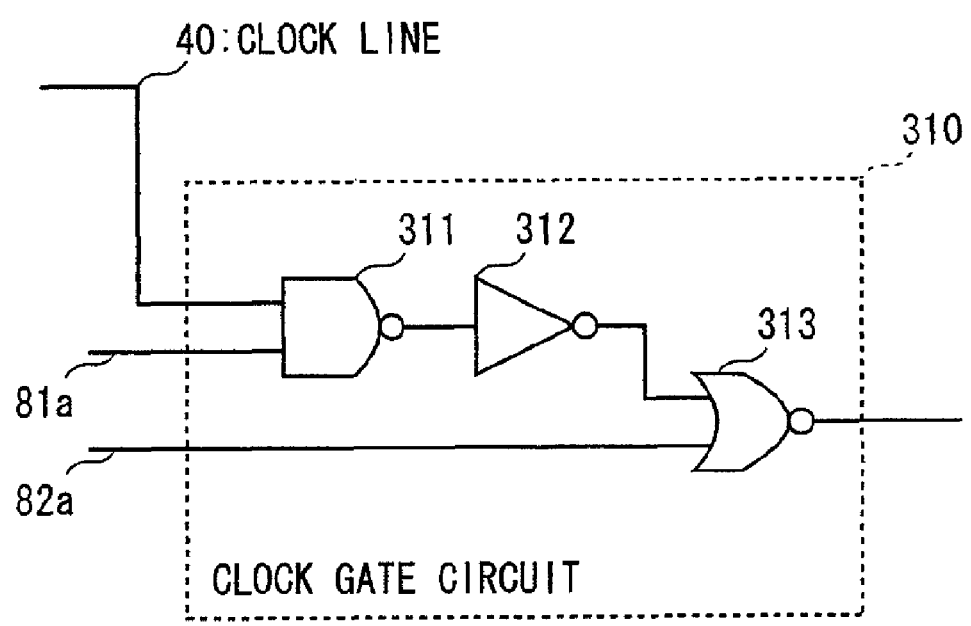
FIG. 12 shows the configuration of a clock gate circuit shown in FIG. 11.

As shown in FIG. 12, the clock gate circuit 310 includes a NAND circuit 311, an inverter circuit 312, and a NOR circuit 313. Two input terminals of the NAND circuit 311 are connected to the clock line 40 and the state control line 80a, respectively. An output terminal of the NAND circuit 311 is connected to an input terminal of the inverter circuit 312. Two input terminals of the NOR circuit 313 are connected to an output terminal of the inverter circuit 312 and the state control line 82a, and an output terminal of the NOR circuit 313 is connected to an input terminal of the inverter circuit 13a.

When the level of the control signal in the state control line 81a is high, and the level of the control signal in the state control line 82a is low, an output signal from the clock gate circuit 310 is a clock signal obtained by inverting the level of the clock signal that is supplied from the clock line 40 to the clock gate circuit 310. When the level of the control signal in the state control line 81a is low, and the level of the control signal in the state control line 82a is low, the output signal from the clock gate circuit 310 is a clock signal fixed to a high level. Furthermore, when the level of the control signal of the state control signal 81a is either high or low, and the level of the control signal in the state control line 82a is high, the output signal from the clock gate circuit 310 is a clock signal fixed to a low level.

In the logic block 300a having the above-described structure, the control unit 50b causes (i) the level of the control signal in the state control line 81a to be high, (ii) the level of the control signal in the state control line 82a to be low, and the level of the control signal in the state control line 83a to be high, so that the logic block 300a enters the operation state.

The control unit 50b causes (i) the level of the control signal in the state control line 81a to be low, (ii) the level of the control signal in the state control line 82a to be low, and (iii) the level of the control signal in the state control line 83a to be high, so that the clock signal fixed to the high level is input to the control terminal of the logic device 11. As a result, the logic device 11 does not start operating, and the logic block 300a enters a termination state. Note that this termination state is referred to as "high level fixed termination state" hereinafter.

Furthermore, the control unit 50b causes (i) the level of the control signal in the state control line 81a to be either high or low, (ii) the level of the control signal in the state control line 82a to be high, and (iii) the level of the control signal in the state control line 83a to be high, so that the clock signal fixed to the low level is input to the control terminal of the logic device 11. As a result, the logic device 11 does not start operating, and the logic block 300a enters a termination state. Note that this termination state is referred to as "low level fixed termination state" hereinafter. Note that, in the case of causing the logic block 300a to be in the low level fixed termination state, a description is provided as follows: one of the control unit 50b and the state control unit 54b causes "the level of the control signal in the state control line 82a to be high, and the level of the control signal in the state control line 83a to be high".

Furthermore, the control unit 50b causes (i) the level of the control signal in the state control line 81a to be either high or low, (ii) the level of the control signal in the state control line 82a to be either high or low, and (iii) the level of the control signal in the state control line 83a to be low, so that power is not supplied to the clock gate circuit 310, the inverter circuits 13a and 13b, and the logic device 11. As a result, the clock gate circuit 310, the inverter circuits 13a and 13b, and the logic device 11 do not start operating, and the logic block 300a enters a termination state. Note that this termination state is referred to as "power cutoff termination state" hereinafter. Note that, in the case of causing the logic block 300a to be in the power cutoff termination state, a description is provided as follows: one of the control unit 50b and the state control unit 54b causes "the level of the control signal in the state control line 83a to be low".

The above-described explanation can also be applied to the logic blocks 300b to 300d.

Figure 13:
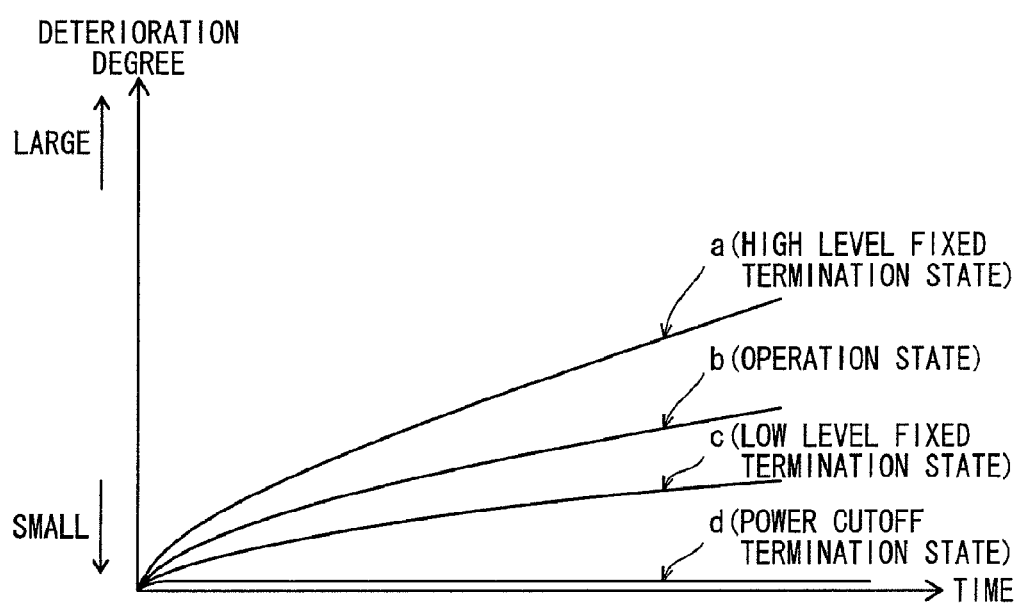
FIG. 13 shows an outline of a deterioration characteristic in each state of the logic block shown in FIG. 11.

In the present embodiment, it is assumed that the logic blocks 300a to 300d deteriorate in accordance with the deterioration characteristic shown in FIG. 13, in each of the operation/termination state (namely, the operation state, the high level fixed termination state, the low level fixed termination state, and the power cutoff termination state). It is also assumed that the logic blocks 300a to 300d are easy to deteriorate in order of the high level fixed termination state, operation state, low level fixed termination state, and power cutoff termination state.

Note that the arrow a in FIG. 13 indicates the deterioration characteristic of the logic block in the high level fixed termination state, the arrow b indicates the deterioration characteristic of the logic block in the operation state, the arrow c indicates the deterioration characteristic of the logic block in the low level fixed termination state, and the arrow d indicates the deterioration characteristic of the logic block in the power cutoff termination state.

(Configuration of Deterioration Degree Holding Unit)

The deterioration degree holding unit 320 measures the number of rising edges (the number of clocks) of the clock signal CLK oscillated by an oscillation circuit that is not shown.

The deterioration degree holding unit 320 holds a storage table for storing the deterioration degrees and operation/termination states of the respective logic blocks 300a to 300d. FIG. 14 shows one example of the storage table. Note here that "block A", "block B", "block C", and "block D" denote logic blocks 300a, 300b, 300c, and 300d, respectively. For example, in a case where the current configuration of the semiconductor integrated circuit 1b is a configuration a, and the configuration of the semiconductor integrated circuit 1b immediately before the configuration a is a configuration b, the field "deterioration degree" stores the deterioration degrees of when the configuration b is finished, and the field "operation/termination state" stores the operation/termination states (operation state, high level fixed termination state, low level fixed termination state, power cutoff termination) of the respective logic blocks 300a to 300d in configuration a.

The deterioration degree holding unit 320 further holds the deterioration characteristic of one or more the logic blocks in the operation state, high level fixed termination state, low level fixed termination state, and power cutoff termination state, respectively, which are shown in FIG. 13.

(Configuration of Control Unit)

The control unit 50b includes the power operation judgment unit 51, a discharge operation processing unit 52b, a charge operation processing unit 53b, and a state control unit 54b.

Upon receipt of an instruction signal for the discharge operation process from the power operation judgment unit 51, the discharge operation processing unit 52b updates, for each of the logic blocks 300a to 300d, the content stored in the field "deterioration degree" of the storage table in FIG. 14 held by the deterioration degree holding unit in the following manner, and resets the number of clocks that is being measured by the deterioration degree holding unit 320 to "0".

Figure 15:
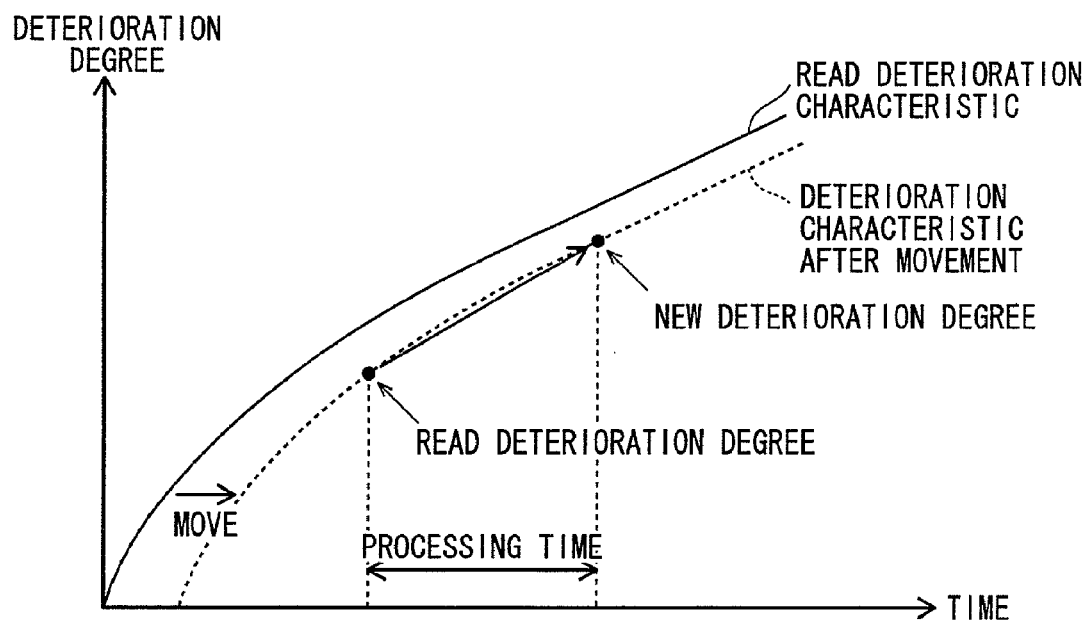
FIG. 15 is a diagram for explaining a method for calculating the deterioration degree of the logic block, the calculation being performed by a discharge operation processing unit and a charge operation processing unit shown in FIG. 11.

As shown in FIG. 15, the discharge operation processing unit 52b reads, from the deterioration degree holding unit 320, a deterioration characteristic corresponding to the operation/termination state (operation state, high level fixed termination state, low level fixed termination state, and power cutoff termination state) stored in the field "operation/termination state" of a logic block that is targeted. Then, the discharge operation processing unit 52b reads a deterioration degree from the field "deterioration degree" of the target logic block, and moves the read deterioration characteristic in parallel, in the direction of the time axis, so that the read deterioration degree is located on the deterioration characteristic curve. Then, the discharge operation processing unit 52b multiplies the number of clocks held by the deterioration holding unit 320 by the cycle of the clock signal CLK, and calculates the time elapsed from the switch of the previous configuration to the switch of the current configuration (hereinafter referred to as "processing time"). Subsequently, the discharge operation processing unit 52b sets, as a new deterioration degree, a deterioration degree located in a position where the read deterioration degree on the deterioration characteristic curve that has been moved is advanced by the processing time. Then, the discharge operation processing unit 52b stores the new deterioration degree in the field "deterioration degree" of the target logic block.

Furthermore, the discharge operation processing unit 52b determines, among the logic blocks 300a to 300d, a logic block that needs to be operated for the execution of a process that is to be performed by the semiconductor integrated circuit 1b, as an operation block whose operation is to be started (a logic block to be in the operation state). Then, the discharge operation processing unit 52b determines the rest of the logic blocks as logic blocks whose operations are to be terminated by cutting the power cutoff (logic blocks to be in the power cutoff termination state). Then, the discharge operation processing unit 52b outputs, to the state control unit 54b, a first state notification signal that includes information indicating the operation/termination state of each logic block. Also, the discharge operation processing unit 52b stores, in the storage table shown in FIG. 14, "operation state" in the field "operation/termination state" corresponding to the logic block that has been determined to be in the operation state, and "power cutoff termination state" in the field "operation/termination state" corresponding to the logic blocks that have been determined to be in the power cutoff termination state.

Upon receipt of the instruction signal for the charge operation process from the power operation judgment unit 51, the charge operation processing unit 53b performs, for each of the logic blocks 300a to 300d, a process that is substantially the same as the process described above with reference to FIG. 15, and updates the content stored in the field "deterioration degree" in the storage table of FIG. 14 that is held by the deterioration degree holding unit 320. Then, the charge operation processing unit 53b resets the number of clocks that is being measured by the deterioration degree holding unit 320 to "0".

Also, the charge operation processing unit 53b determines, among the logic blocks 300a to 300d, a logic block that needs to be operated for the execution of a process that is to be performed by the semiconductor integrated circuit 1b, as an operation block whose operation is to be started (a logic block to be in the operation state). Then, the charge operation processing unit 53b determines each of the logic blocks other than the logic block that has been determined to be in the operation state, as any one of (i) a logic block to be in the operation state, (ii) a logic block to be in the power cutoff termination state, (iii) a logic block to be in the high level fixed termination state, and (iv) a logic block to be in the low level fixed termination state, based on deterioration degree after the above-described update in the storage table shown in FIG. 14. Then, the charge operation processing unit 53b outputs, to the state control unit 54b, the second state notification signal that includes information indicating the operation/termination state of each logic block. Also, the charge operation processing unit 53b stores, in the storage table shown in FIG. 14, "operation state" in the field "operation/termination state" corresponding to the logic block that has been determined to be in the operation state, "power cutoff termination state" in the field "operation/termination state" corresponding to the logic block that has been determined to be in the power cutoff termination state, "low level fixed termination state" in the field "operation/termination state" corresponding to the logic block that has been determined to be in the low level fixed termination state, and "high level fixed termination state" in the field "operation/termination state" corresponding to the logic block that has been determined to be in the high level fixed termination state.

The state control unit 54b controls the level of each control signal in the respective state control lines 81a to 83a, based on the first state notification signal and the second state notification signal.

Note that when causing a logic block to be in the operation state, the state control unit 54b sets the level of a control signal in the state control line 81a to a high level, the level of a control signal in the state control line 82a to a low level, and the level of a control signal in the state control line 83a to a high level, the state control lines 81a to 83a corresponding to the logic block to be in the operation state.

Also, when causing a logic block to be in the high level fixed termination state, the state control unit 54b sets the level of a control signal in the state control line 81a to a low level, the level of a control signal in the state control line 82a to a low level, and the level of a control signal in the state control line 83a to a high level, the state control lines 81a to 83a corresponding to the logic block to be in the high level fixed termination state.

Furthermore, when causing a logic block to be in the low level fixed termination state, the state control unit 54b sets the level of a control signal in the state control line 82a to a high level, and the level of a control signal in the state control line 83a to a high level, the state control lines 82a and 83a corresponding to the logic block to be in the low level fixed termination state.

Also, when causing a logic block to be in the power cutoff termination state, the state control unit 54b sets the level of a control signal in the state control line 83a to a low level, the state control line 83a corresponding to the logic block to be in the power cutoff termination state.

<Operation>

Figure 16:
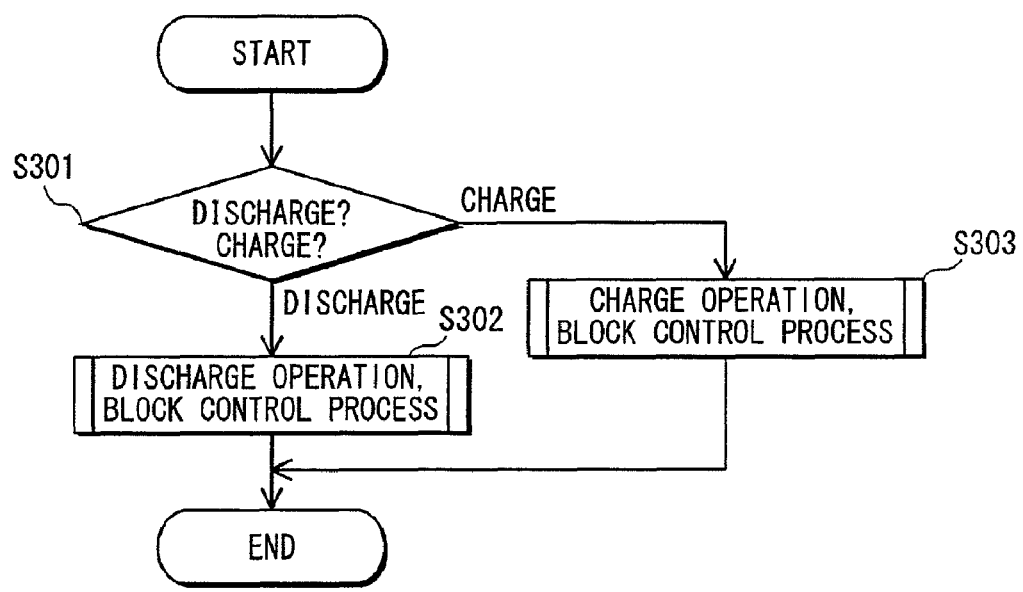
FIG. 16 is a flowchart showing the steps of a logic block control process performed by the semiconductor integrated circuit shown in FIG. 11.

The following describes the operation of the semiconductor integrated circuit 1b with reference to FIG. 16, whose configuration has been described with reference to FIGS. 11 to 15. FIG. 16 is a flowchart showing the steps of a logic block control process performed by the semiconductor integrated circuit 1b shown in FIG. 11.

The power operation judgment unit 51 judges whether the operation of the power unit is the discharge operation or the charge operation, based on the power operation notification signal input from the power operation detection unit 60, at the timing of switching the configuration of the semiconductor integrated circuit 1b (step S301).

Figure 17:
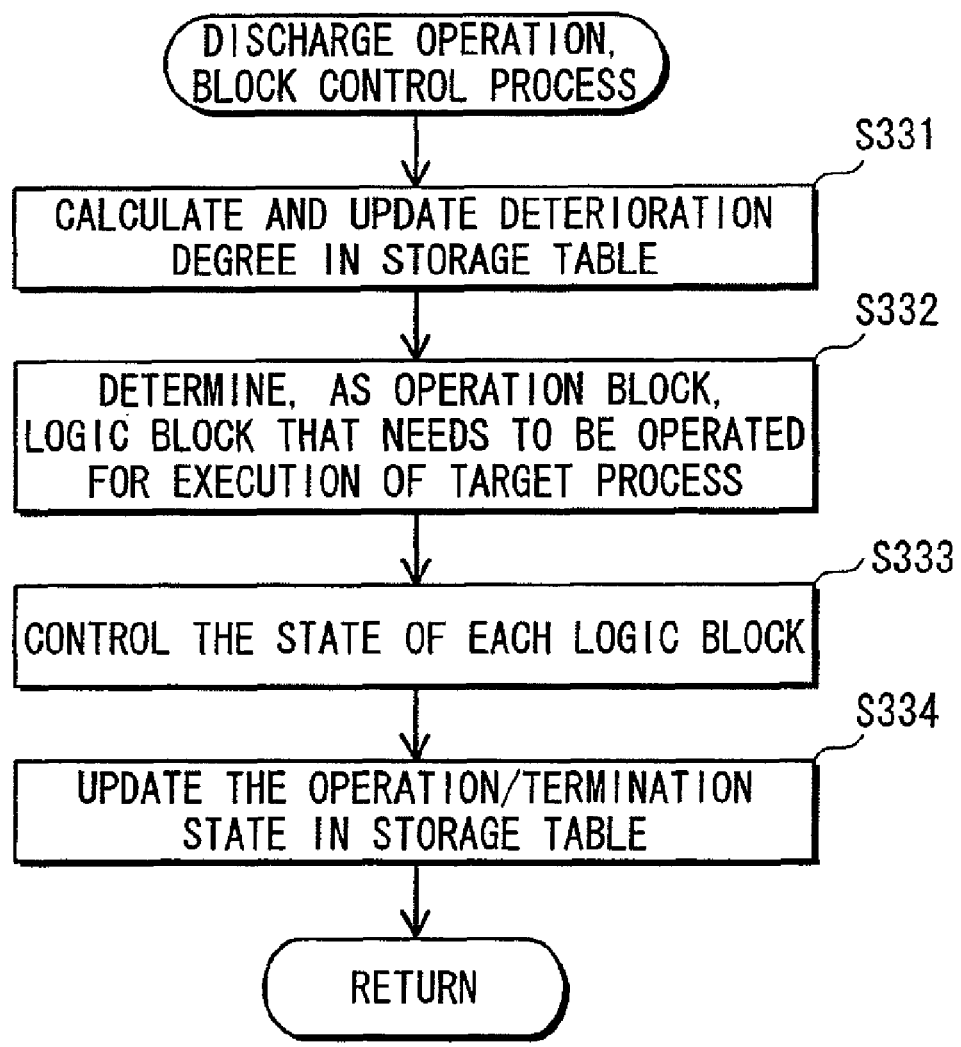
FIG. 17 is a flowchart showing the steps of a discharge-operation block control process shown in FIG. 16.
Figure 18:
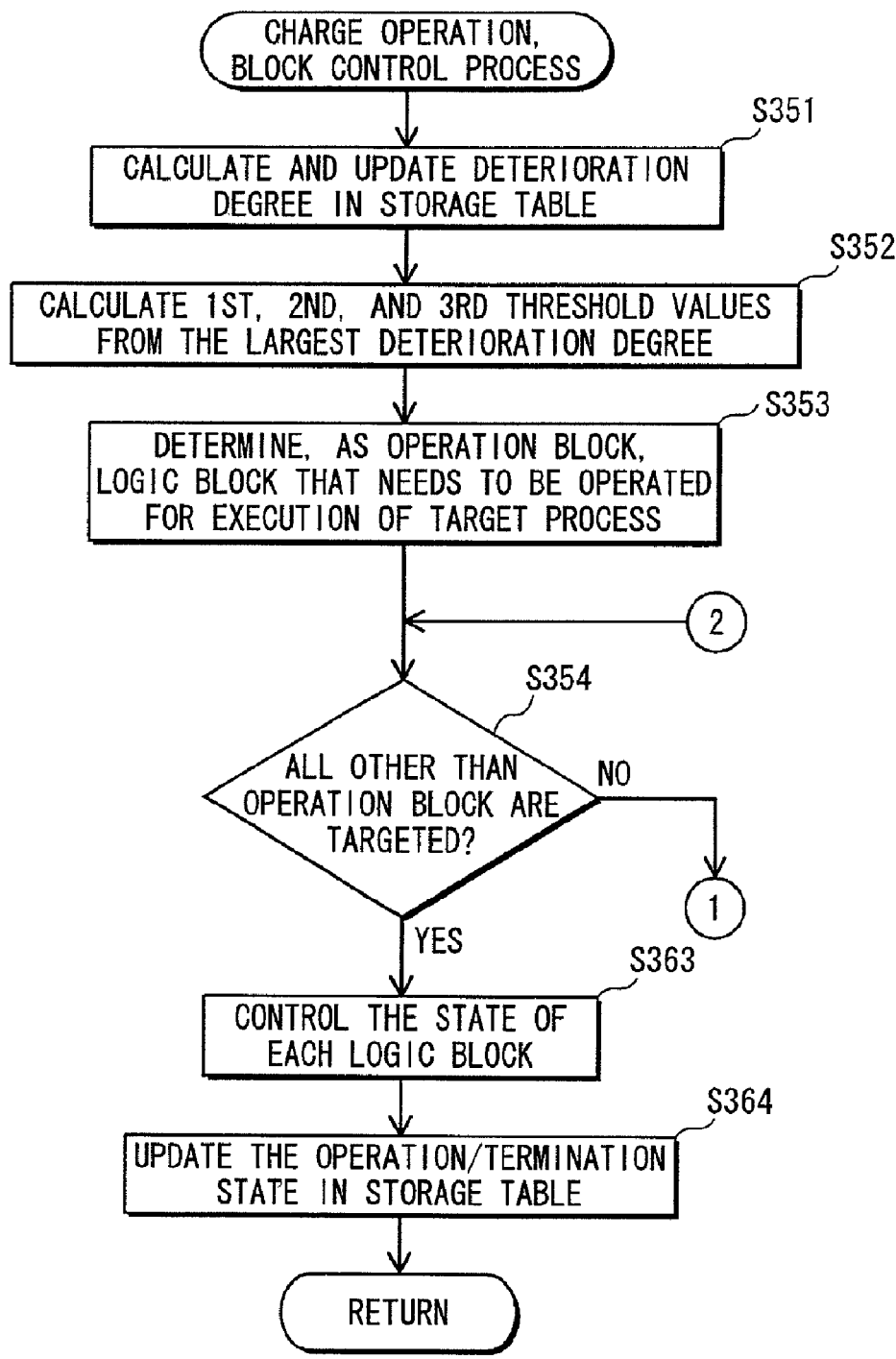
FIG. 18 is a flowchart showing the steps of a charge-operation block control process shown in FIG. 16.
Figure 19:
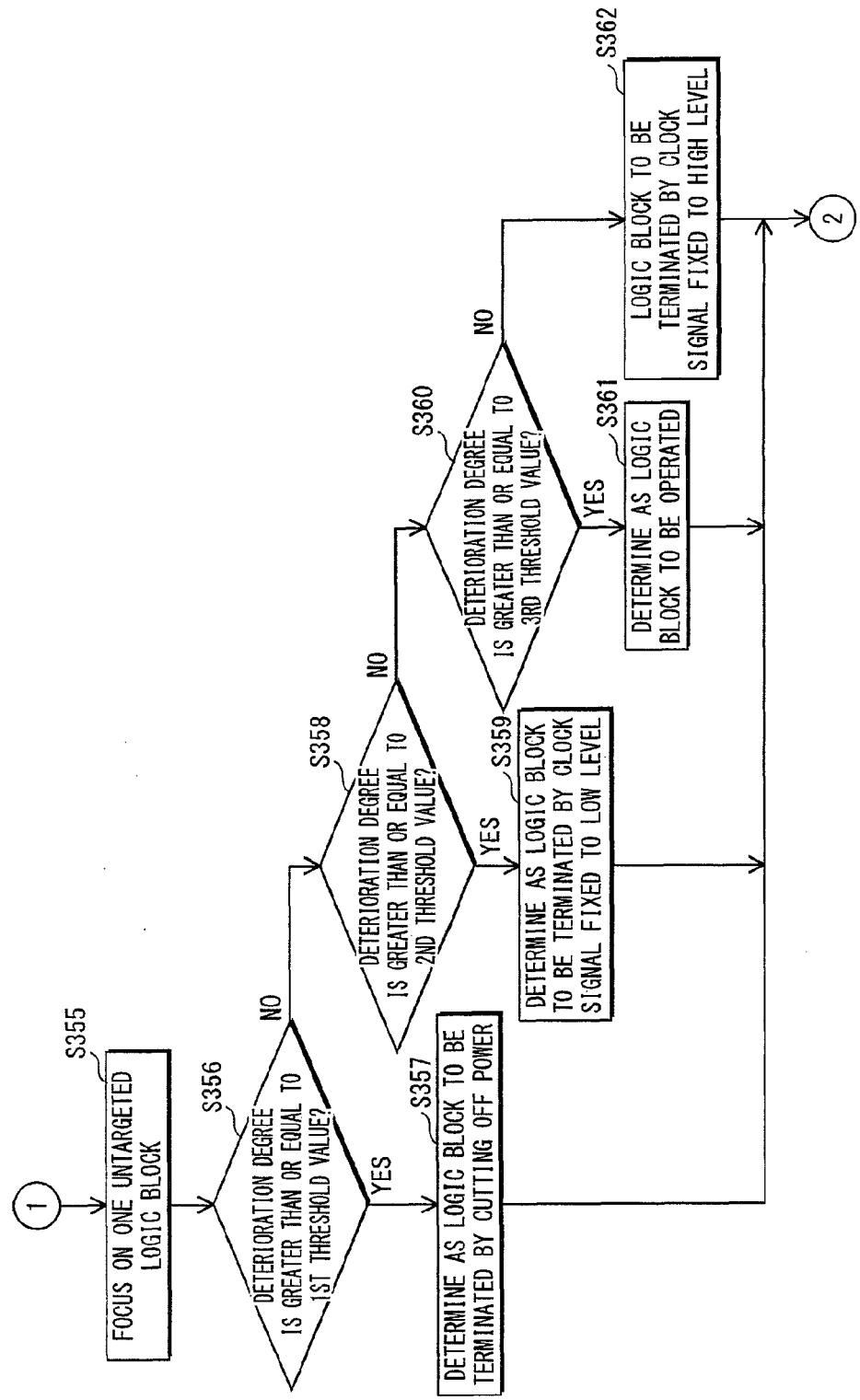
FIG. 19 is a flowchart showing the steps of the charge-operation block control process shown in FIG. 16.

When the operation of the power unit is judged to be the discharge operation by the power operation judgment unit 51 (S 301: discharge), the discharge operation processing unit 52*b* and the state control unit 54*b* perform a discharge-operation block control process whose steps are shown in FIG. 17 (step S302). When the operation of the power unit is judged to be the charge operation by the power operation judgment unit 51 (S301: charge), the charge operation processing unit 53*b* and the state control unit 54*b* perform a charge-operation block control process whose steps are shown in FIGS. 18 and 19 (step S303).

(Discharge-Operation Block Control Process)

The following describes the discharge-operation block control process (step S302) shown in FIG. 16, with reference to FIG. 17. FIG. 17 is a flowchart showing the steps of the discharge-operation block control process (step S302) shown in FIG. 16.

The discharge operation processing unit 52*b* calculates and updates the deterioration degree of each of the logic blocks 300*a* to 300*d* in the storage table shown in FIG. 14, and resets the number of clocks that is being measured by the deterioration degree holding unit 320 to "0" (step S331).

The discharge operation processing unit 52*b* determines, as an operation block whose operation is to be started (a logic block to be in the operation state), a logic block that needs to be operated for the execution of a process that is to be performed (target process) by the semiconductor integrated circuit 1*b*, and also determines, as logic blocks whose operations are to be terminated by cutting off the power (logic blocks that are to be in the power cutoff termination state), logic blocks other than the logic block that has determined to be the operation block (step S332).

The state control unit 54*b* controls the signal level of each control signal of the respective state control lines 81*a* to 83*a*, so that the logic blocks 300*a* to 300*d* are in the operation/termination state (operation state, power cutoff termination state) that has been determined in step S332 (step S333). In this way, each of the logic blocks 300*a* to 300*d* enters the operation/termination state that has been determined in step S332.

The discharge operation processing unit 52*b* updates the content stored in the field "operation/termination state" of the logic blocks 300*a* to 300*d*, in the storage table shown in FIG. 14, to the operation/termination state (operation state, power cutoff termination state) that has been determined in step S332. Then, the control unit 50*b* returns to the process shown in FIG. 16.

(Charge-Operation Block Control Process)

The following describes the charge-operation block control process (step S303) shown in FIG. 16, with reference to FIGS. 18 and 19. FIGS. 18 and 19 are flowcharts showing the steps of the charge-operation block control process (step S303) shown in FIG. 16.

The charge operation processing unit 53*b* calculates and updates the deterioration degree of each of the logic blocks 300*a* to 300*d* in the storage table shown in FIG. 14, and resets the number of clocks that is being measured by the deterioration degree holding unit 320 to "0" (step S351).

The charge operation processing unit 53*b* specifies the largest deterioration degree between the updated deterioration degrees of the logic blocks 300*a* to 300*d*, and multiplies the specified largest deterioration degree by a first coefficient, second coefficient, and third coefficient that have been predetermined, thereby calculating a first threshold value, second threshold value, and third threshold value (step S352). Note that each of the first, second and third coefficients is a value that is in the range of 0 to 1. Also, the first coefficient has the largest value, the second coefficient has the second largest value, and the third coefficient has the smallest value.

The charge operation processing unit 53*b* determines a logic block that needs to be operated for the execution of a process that is to be performed (target process) by the semiconductor integrated circuit 1*b*, as an operation block whose operation is to be started (a logic block to be in the operation state) (step S353). Note that the logic block that has been determined as the operation block whose operation is to be started in step S353 is referred to as "operation block".

The charge operation processing unit 53*b* judges whether all logic blocks other than the operation block have been targeted for the process of the steps S355 to S362 (step S354).

When judging that all logic blocks other than the operation block have not been targeted for the process (S354: NO), the charge operation processing unit 53*b* focuses on one of the logic blocks that have not been targeted for the process (step S355). Then, the charge operation processing unit 53*b* judges whether the deterioration degree of the focused logic block is greater or equal to the first threshold value (step S356).

When judging that the deterioration degree of the focused logic block is greater than or equal to the first threshold value (S356: YES), the charge operation processing unit 53*b* determines the focused logic block as a logic block that is to be in the power cutoff termination state where deterioration is least likely to develop (step S357), and proceeds to the process of step S354. When judging that the deterioration degree of the focused logic block is not greater than or equal to the first threshold value (S356: NO), the charge operation processing unit 53*b* judges whether the deterioration degree of the focused logic block is greater or equal to the second threshold value (step S358).

When judging that the deterioration degree of the focused logic block is greater than or equal to the second threshold value (S358: YES), the charge operation processing unit 53*b* determines the focused logic block as a logic block that is to be in the low level fixed termination state where deterioration is second least likely to develop (step S359), and proceeds to the process of step S354. When judging that the deterioration degree of the focused logic block is not greater than or equal to the second threshold value (S358: NO), the charge operation processing unit 53*b* judges whether the deterioration degree of the focused logic block is greater or equal to the third threshold value (step S360).

When judging that the deterioration degree of the focused logic block is greater than or equal to the third threshold value (S360: YES), the charge operation processing unit 53*b* determines the focused logic block as a logic block that is to be in the operation state where deterioration is third least likely to develop (step S361), and proceeds to the process of step S354. When judging that the deterioration degree of the focused logic block is not greater than or equal to the third threshold value (S360: NO), the charge operation processing unit 53*b* determines the focused logic block as a logic block that is to be in the high level fixed termination state where deterioration is most likely to develop (step S362) and proceeds to the process of step S354.

When the charge operation processing unit 53*b* judges that all logic blocks other than the operation block have been targeted for the process (S354: YES), the state control unit 54*b* controls the level of each of the control signals in the respective state control lines 81*a* to 83*a*, so that each of the logic blocks 300*a* to 300*d* is in the respective operation/termination states (operation state, power cutoff termination state, low level fixed termination state, and high level fixed termination state) that have been determined by the process of steps S353 to 362 (step S363). In this way, each of the logic blocks 300a to 300d enters the respective operation/termination states that have been determined in the process of steps S353 to S362.

The charge operation processing unit 53b updates the content stored in the field "operation/termination state" of each of the logic blocks 300a to 300d in the storage table shown in FIG. 14 in the respective operation/termination states (operation state, power cutoff termination state, low level fixed termination state, and high level fixed termination state) that have been determined in the process of steps S353 to S362 (step S364). Then, the control unit 50b returns to the process of FIG. 16.

The semiconductor integrated circuit 1b of the above-described present embodiment can adjust the deterioration degree of each logic block more accurately than the semiconductor integrated circuit 1 of the first embodiment and the semiconductor circuit 1a of the second embodiment.

Fourth Embodiment

The following describes the fourth embodiment with reference to the drawings.

In the present embodiment, the semiconductor integrated circuit 1 described in the first embodiment is mounted on a mobile telephone.

In a case where a mobile telephone 400 according to the present embodiment operates with use of only a power supply from a storage battery attached thereto, without a power supply from a commercial power source, as shown in FIG. 20A, it is preferable that the mobile telephone 400 operates with low power in view of the operation time. In this case, the storage battery (corresponding to the power unit described above) attached to the mobile telephone 400 performs the discharge operation.

Also, in a case where the mobile telephone 400 operates with use of either (i) a power supply from the commercial power source by being attached to a charge stand connected to an outlet 420 or (ii) a power supply from the commercial power source by being connected directly to the outlet 420, as shown in FIG. 20B, it is not particularly necessary that the mobile telephone 400 operates with low power in view of the operation time. In this case, the storage battery attached to the mobile telephone 400 performs the charge operation.

<Configuration>

Figure 21:
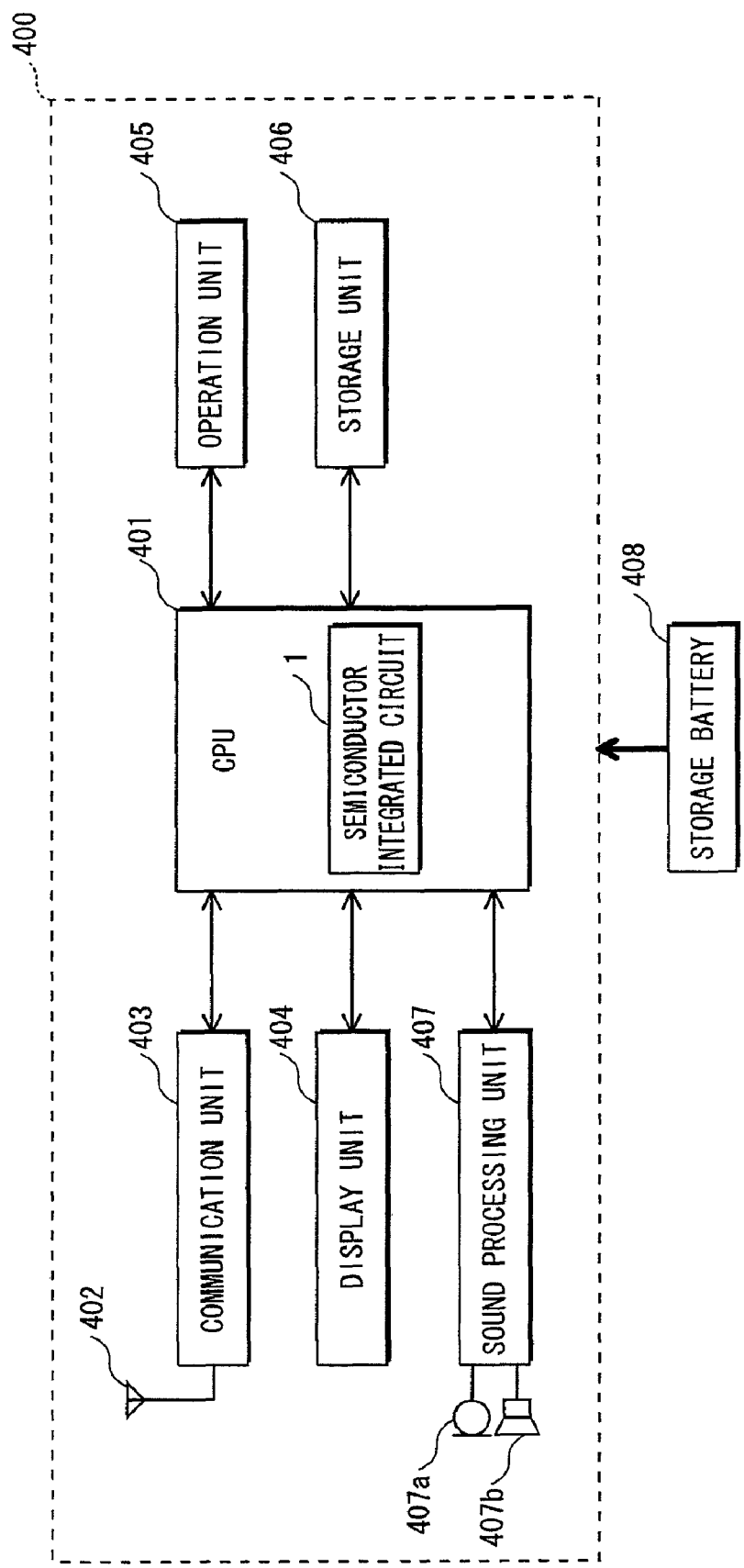
FIG. 21 shows the configuration of the mobile telephone shown in FIG. 20.

As shown in FIG. 21, the mobile telephone 400 of FIG. 20 includes a CPU (Central Processing Unit) 401, an antenna 402, a communication unit 403, a display unit 404, an operation unit 405, a storage unit 406, an sound processing unit 407, a microphone 407a, and a speaker 407b. Also, the mobile telephone 400 has attached thereto a storage battery 408.

The CPU 401 controls the entirety of the mobile telephone 400, and includes the semiconductor integrated circuit 1 described in the first embodiment. Note that, in the case where the mobile phone 400 is either attached to the charge stand 410 or connected directly to the outlet 420, the power operation detection unit 60 detects that the storage battery 408 is in the charge operation, and in other cases, the power operation detection unit 60 detects that the storage battery 408 is in the discharge operation. Note that the configuration and operation of the semiconductor integrated circuit 1 have already been described in the first embodiment.

The communication unit 403 is used for sound and data communications, and transmits and receives signals to/from another apparatus via the antenna 402. The communication unit 403 outputs a reception signal received by the antenna 402, and transmits, from the antenna 402, a transmission signal input from the CPU 401.

The display unit 404 is composed of a liquid crystal display or the like, and displays display data input from the CPU 401. The operation unit 405 is composed of a plurality of keys, and outputs, to the CPU 401, the push signal of a key that has been pushed. The storage unit 406 has stored therein control programs for controlling the mobile phone 400, and application software programs.

The microphone 407a collects sounds in the vicinity thereof, and outputs the sounds to the sound processing unit 407. The sound processing unit 407 converts analog signals input from the microphone 407a, to digital signals, and outputs the digital signals to the CPU 401. The sound processing unit 407 converts the digital signals input from the CPU 401, to analog signals, and outputs the analog signals to the speaker 407b. The speaker 407b converts the analog signals input from the sound processing unit 407 to sounds and outputs the sounds.

The mobile telephone 400 performs a plurality of operations, such as a communication in accordance with a radio wave state, a communication in accordance with each of a plurality of communication methods, and a display operation in which contents that are encoded by different standards from each other are displayed. In each of the plurality of operations, the semiconductor integrated circuit 1 uses a different number of logic blocks.

For example, the mobile telephone 400 performs a communication in accordance with a first communication method that requires four logic blocks to be in operation, and a communication in accordance with a second communication method that requires one logic block to be in operation. In this case, the semiconductor integrated circuit 1 included in the mobile telephone 400 controls the operation and termination of each of the logic blocks 10a to 10d, as described above with reference to FIGS. 8A and 8B.

<<Supplemental Remarks>>

Although the present invention has been described by way of the above embodiments, it should be obvious that the present invention is not limited to the above, and can be realized in any embodiments that are for achieving the purpose of the present invention and purposes pertaining to or associated with the present invention. For example, the following modifications are applicable.

(1) The semiconductor integrated circuit 1 in the first to third embodiments is a programmable logic circuit. However, it is not limited to such and may be, for example, a semiconductor integrated circuit that has a plurality of logic blocks, and that can perform the control of the operation and termination of each logic block in the unit of one or more logic blocks.

(2) In the first to third embodiments, the control of the operation and termination is performed for each logic block. However, it is not limited to such. For example, the control of the operation and the termination may be performed in the unit of two or more logic blocks. Furthermore, the number of logic blocks included in one unit may be different between the control of the operation and the control of the termination, and the number of logic blocks included in one unit for the control of the operation may be one or more. This makes it possible to save line resources and logic resources necessary for the control of the operation states of the logic blocks, such as the termination of each of the logic blocks.

(3) In the first to third embodiments, the control of the operation and termination is performed for each logic block. However, it is not limited to such. For example, the control of the operation and the termination may be performed in the unit of one or more logic devices.

(4) The first to third embodiments are described while the clock gate circuits 12 and 310 are provided inside the logic blocks. However, the clock gate circuits may be provided outside all the logic blocks. It is also possible that only some of the logic blocks have the clock gate circuits provided outside thereof.

The second and third embodiments are described while the power cutoff circuits 220 and 220b are provided inside the logic blocks. However, the power cutoff circuits may be provided outside all the logic blocks. It is also possible that only some of the logic blocks have the power cutoff circuits provided outside thereof.

(5) In the first to third embodiments, the control units 50 and 50b are provided separately from the logic blocks. However, one of the logic blocks may be used as the control unit, as long as the logic block used as the control unit does not terminate its operation. It is also possible that a certain area in the logic block is used as the control unit, as long as the certain area does not terminate its operation. In this case, the semiconductor integrated circuit can be made smaller and operate with lower power, by using, as the control unit, a logic block having an appropriate logic granularity for control.

It is also possible to mount the control units 50 and 50b in semiconductor integrated circuits that are different from the semiconductor integrated circuit having the logic blocks.

(6) In the first to third embodiments, the number of logic blocks is four. However, the number of logic blocks is not limited to four.

(7) In the semiconductor integrated circuit according to the first embodiment, a clock signal fixed to a high level is input to the control terminal of the logic device 11, so as to terminate the operation of the logic device 11. However, it is not limited to such. The operation of the logic device may be terminated by supplying a clock signal fixed to a low level to the control terminal of the logic device.

(8) In the first embodiment, the NAND circuit is used as the clock gate circuit 12. However, the configuration of the clock gate circuit is not specifically determined. For example, a NOR circuit may be used instead of the NAND circuit.

Also, in the third embodiment, a clock gate circuit having the configuration shown in FIG. 12 is used as the clock gate circuit 310. However, the configuration of the clock gate circuit 310 is not limited to the configuration shown in FIG. 12.

(9) In the power cutoff circuits 220 and 220b according to the second and third embodiments, switching units are each provided (i) between the power source and the module 260 and (ii) between the module 260 and the ground plate. However, it is not limited to such. For example, the switching unit may be provided only between the power source and the module 260, or only between the module 260 and the ground plate.

Also, the switching unit of each of the power cutoff circuits 220 and 220b does not always need to be a pair of the NMOS transistor and the PMOS transistor. However, it is preferable that the switching unit used in the power cutoff circuits 220 and 220b has small leak current.

(10) In the first to third embodiments, as for the logic blocks whose operations are to be started, other than the logic blocks that need to be operated for the execution of the processes that are to be performed by the semiconductor integrated circuits 1, 1a, and 1b, only part of the logic blocks pertaining to the clock signals may be operated.

(11) In the third embodiment, in a case where the power unit is performing the charge operation, the control unit 50b controls the operation/termination state of each of the logic blocks other than the operation block (the operation block being the logic block that needs to be operated for the execution of a target process performed by the semiconductor integrated circuit 1b), in a manner that each of the logic blocks enters a respective one of the low level fixed termination state, operation state, high level fixed termination state, and power cutoff termination state. However, it is not limited to such. For example, in the case where the power unit is performing the charge operation, the control unit may control the operation/termination state of each of the logic blocks other than the operation block, in a manner that each of the logic blocks enters a corresponding one of the three operation/termination states that have been arbitrarily selected from the above-described states, or in a manner that each of the logic blocks enters a corresponding one of the two operation/termination states that have been arbitrarily selected from the above-described states.

(12) In the third embodiment, in a case where the power unit is performing the discharge operation, the control unit 50b controls the operation/termination state of each of the logic blocks other than the operation block (the operation block being the logic block that needs to be operated for the execution of a target process performed by the semiconductor integrated circuit 1b), in a manner that each of the logic blocks enters the power cutoff termination state. However, it is not limited to such. The control unit 50b may control the operation/termination state of each of the logic blocks other than the operation block in a manner that each of the logic blocks enters the low level fixed termination state, or in a manner that each of the logic blocks enters the high level fixed termination state.

(13) In the first to third embodiments, the content of the control of the operation and termination of each of the logic blocks is switched depending on whether the power unit is performing the discharge operation or the charge operation. However it is not limited to such, and the following is also acceptable.

For example, the content of the control of the operation and termination of each of the logic blocks may be switched, depending on whether the power unit is performing a discharge operation not pertaining to a refresh operation or a discharge operation for the refresh operation. In this case, a process may be performed that is substantially the same as the process shown by either the flowchart of FIG. 6 or that of FIG. 17 in the discharge operation not pertaining to the refresh operation, and a process may be performed that is substantially the same as the process shown by either the flowchart of FIG. 7 or that of FIGS. 18 and 19 in the discharge operation for the refresh operation.

Also, the content of the control of the operation and termination of each of the logic blocks may be switched, depending on whether the power unit is performing (i) the discharge operation not pertaining to the refresh operation, (ii) the discharge operation for the refresh operation, or (iii) the charge operation. In this case, the process may be performed that is substantially the same as the process shown by either the flowchart of FIG. 6 or that of FIG. 17 in the discharge operation not pertaining to the refresh operation, and the process may be performed that is substantially the same as the process shown by either the flowchart of FIG. 7 or that of FIGS. 18 and 19 in the discharge operation for the refresh operation and in the charge operation.

(14) In the first to third embodiments, it is unnecessary to save power during the charge operation of the power unit. However, it is not limited to such. The operation of the power unit in which power saving is unnecessary may be, for example, the discharge operation for the refresh operation.

(15) In the first and second embodiments, the control unit 50 adds the predetermined value to the minimal termination rate, and thereby obtains the operation threshold value. However, it is not limited to such. For example, the following is also acceptable. The control unit may multiply the minimal termination rate by the predetermined coefficient, and set a value obtained by the multiplication to the operation threshold value. Also, the control unit may set an addition value to the operation threshold value, the addition value being obtained by adding the minimal termination rate to a value set in a manner that a difference of delayed deterioration rates due to a difference of the termination rates is smaller than a ratio of the minimal delay amount of data with respect to the maximum delay amount of a clock.

(16) In the first and second embodiments, in a case where the power unit is performing the charge operation, the control unit 50 uses the termination rates of the respective logic blocks, in order to determine the operation/termination states of the logic blocks other than the operation blocks (the operation blocks being the logic blocks that need to be operated for the execution of each process that is to be performed by the semiconductor integrated circuits 1 and 1a, respectively). However, it is not limited to such, and the following is also acceptable.

For example, the control unit may use the termination time itself in order to determine the operation/termination state of each of the logic blocks other than the operation block. Note that the termination time of each of the logic blocks is calculated by subtracting the number of operation clocks of the logic block from the number of operation clocks of the entirety of the semiconductor integrated circuit, so as to obtain a subtraction value, and multiplying the obtained subtraction value by the cycle of the clock signal CLK.

The control unit may use either the operation rate of each logic block or the operation time itself, in order to determine the operation/termination state of each of the logic blocks other than the operation block. When the operation rate or the operation time is used, the control unit may determine, as the operation block whose operation is to be started, only (i) a logic block whose operation rate is smaller than a value obtained by subtracting, from the maximum operation rate, a value determined by a predetermined method or (ii) a logic block whose operation time is smaller than a value obtained by subtracting, from the maximum operation time, a value determined by a predetermined method. Note that the operation rate of each of the logic blocks is calculated by dividing the number of operation clocks of the logic block by the number of operation clocks of the entirety of the semiconductor integrated circuit. Also, the operation time of each of the logic blocks is calculated by multiplying the number of operation clocks of the logic block by the cycle of the clock signal CLK.

Also, in order to determine the operation/termination state of the logic blocks other than the operation block, the control unit may use the number of operations of each of the logic blocks, or the number of terminations thereof. In this case, the size of the circuit of the operation amount holding unit may be smaller.

Furthermore, for each of the logic blocks 10a to 10d, a function F may be prepared that shows the delay fluctuation amount of the logic block with time being a variable. The control unit may then calculate F(Tstop)/F(Tall), and control the operation and termination of each of the logic blocks 10a to 10d, in a manner that F(Tstop)/F(Tall) of each of the logic blocks 10a to 10d becomes close to each other. Note that Tstop denotes a time period in which a corresponding logic block is not in operation, and Tall is a time period in which the semiconductor integrated circuit is in operation.

Also, it is possible to cause the clock skew to be smaller by setting the function F that shows the delay fluctuation amount in consideration of the configuration of each of the clock gate circuits 12 and 310 onward.

(17) In the first to third embodiments, each of the control units 50 and 50b uses the state control lines exclusively for controlling the state of the logic blocks. However, it is not limited to such. For example, the control units may control the operation/termination state of the logic blocks, by causing the semiconductor integrated circuits 1, 1a, and 1b to have an internal logic based on the configuration information in which the operation/termination state of each logic block has been determined, with use of the configuration control lines for controlling the configuration of each of the semiconductor integrated circuits 1, 1a, and 1b.

(18) In the first to third embodiments, the state of each logic block is determined only at the timing in which each configuration of the semiconductor integrated circuits 1, 1a and 1b is switched. However, it is not limited to such. For example, the state of each logic block may be determined in accordance with a predetermined time period, or may be determined in advance.

(19) In the third embodiment, it is assumed that the deterioration is likely to develop in order of the high level fixed termination state, operation state, low level fixed termination state, and power cutoff termination state. However, it is not limited to such. The order in which the deterioration is likely to develop may be determined for each logic block in the actual product.

(20) In the third embodiment, the control unit 50b calculates the deterioration degree of each logic block by moving the deterioration characteristic curve in parallel in the direction of the time axis, etc. However, it is not limited to such. For example, functions may be prepared that each correspond to the respective deterioration characteristics of the operation state, low level fixed termination state, high level fixed termination state, and power cutoff termination state. Then, the control unit may calculate the deterioration degree of each logic block, with use of the functions.

(21) In the first and second embodiments, the control unit 50 may determine, in steps S132 and S154, the number of logic blocks necessary for the execution of a process that is to be performed by each of the semiconductor integrated circuits 1 and 1a, and determine the number of logic blocks as the logic blocks to be operated, in order of decreasing termination amount.

Also, in the third embodiment, the control unit 50b may determine, in steps S332 and S353, the number of logic blocks necessary for the execution of a process that is to be performed by each of the semiconductor integrated circuits 1 and 1a, and determine (i) the operation blocks whose operations are to be started, and (ii) the number of the operation blocks which is determined based on the deterioration degrees.

(22) In the fourth embodiment, the mobile telephone 400 includes the semiconductor integrated circuit 1 in the first embodiment. However, it is not limited to such. The mobile telephone 400 may include the semiconductor integrated circuit 1a in the second embodiment, the semiconductor integrated circuit 1b in the third embodiment, or a semiconductor integrated circuit obtained by modifying the semiconductor integrated circuits 1, 1a, and 1b.

(23) In the fourth embodiment, a description is provided while the mobile phone is taken as an example as a target for mounting the semiconductor integrated circuit. However, it is not limited to such. The target for mounting the semiconductor integrated circuit may be, for example, (i) a mobile terminal such as PDA (Personal Digital Assistant), (ii) an image display device such as a TV, a DVD player, or a car navigation system, (iii) an image recording device such as a DVD recorder, a video camera, a digital still camera, or a security camera, (iv) a communication system in a communication device, or (v) a security processing system.

(24) The semiconductor integrated circuits 1, 1*a*, and 1*b* in the first to third embodiments may be realized typically as an LSI (Large Scale Integration), which is an integrated circuit. Also, each of the circuits may be made into one chip individually, or may also be made into one chip so as to include part or all of the circuits.

Here, the circuit is described as LSI. However, the LSI may be referred to as an IC (Integrated Circuit), a system LSI, a super LSI, or an ultra LSI in accordance with the degree of integration.

INDUSTRIAL APPLICABILITY

The present invention can be used for controlling the operations of logic blocks included in a semiconductor integrated circuit.

The invention claimed is:

1. A semiconductor integrated circuit comprising:
a plurality of logic blocks each of which is switchable between a plurality of states pertaining to operation and termination;
an operation acquisition unit operable to acquire operation information indicating an operation of a power supply;
a state determination unit operable to determine a state of each of the logic blocks, based on operation/termination information pertaining to a past state of each logic block, when the operation information indicates a charge operation of the power supply in which power saving is unnecessary; and
a state control unit operable to control each logic block so that each logic block enters the state determined by the state determination unit,
wherein when the operation information indicates a discharge operation of the power supply in which power saving is necessary, the state determination unit further determines a state of each logic block that needs to be operated for an execution of a target process to be an operation state in which the respective logic block is in operation.

2. A semiconductor integrated circuit comprising:
a plurality of logic blocks each of which is switchable between a plurality of states pertaining to operation and termination;
an operation acquisition unit operable to acquire operation information indicating an operation of a power supply;
a state determination unit operable to determine a state of each of the logic blocks, based on operation/termination information pertaining to a past state of each logic block, when the operation information indicates a predetermined operation in which power saving is unnecessary; and
a state control unit operable to control each logic block so that each logic block enters the state determined by the state determination unit,
wherein the operation/termination information is a termination rate of each logic block, the termination rate being a rate of the respective logic block having stopped operating in the past, and
wherein the state determination unit determines the state of each logic block based on the termination rate of the logic block when the operation information indicates the predetermined operation.

3. The semiconductor integrated circuit of claim 2, wherein the state determination unit specifies a minimum termination rate between the termination rates of the logic blocks, and determines a state of each logic block having a termination rate whose value is larger than the minimum termination rate by a value determined in accordance with a predetermined method.

4. A semiconductor integrated circuit comprising:
a plurality of logic blocks each of which is switchable between a plurality of states pertaining to operation and termination;
an operation acquisition unit operable to acquire operation information indicating an operation of a power supply;
a state determination unit operable to determine a state of each of the logic blocks, based on operation/termination information pertaining to a past state of each logic block, when the operation information indicates a predetermined operation in which power saving is unnecessary; and
a state control unit operable to control each logic block so that each logic block enters the state determined by the state determination unit,
wherein each of the states pertaining to operation and termination has a different deterioration degree from each other, and
wherein the state determination unit specifies the deterioration degree of each of the logic blocks based on the operation/termination information of the respective logic block, and determines a state of each logic block such that the larger the deterioration degree is, the smaller a state of the deterioration degree is, based on the specified deterioration degree of each logic block.

5. A terminal system comprising:
a power supply; and
a semiconductor integrated circuit including
(i) a plurality of logic blocks each of which is switchable between a plurality of states pertaining to operation and termination,
(ii) an operation acquisition unit operable to acquire operation information indicating an operation of the power supply,
(iii) a state determination unit operable to determine a state of each of the logic blocks, based on operation/termination information pertaining to a past state of each logic block, when the operation information indicates a charge operation of the power supply in which power saving is unnecessary, and
(iv) a state control unit operable to control each logic block so that each logic block enters the state determined by the state determination unit,
wherein when the operation information indicates a discharge operation of the power supply in which power saving is necessary, the state determination unit further determines a state of each logic block that needs to be operated for an execution of a target process to be an operation state in which the respective logic block is in operation.

6. A terminal system comprising:
a power supply; and
a semiconductor integrated circuit including
(i) a plurality of logic blocks each of which is switchable between a plurality of states pertaining to operation and termination, (ii) an operation acquisition unit operable to acquire operation information indicating an operation of the power supply, (iii) a state determination unit operable to determine a state of each of the logic blocks, based on operation/termination information pertaining to a past state of each logic block, when the operation information indicates a predetermined operation in which power saving is unnecessary, and (iv) a state control unit operable to control each logic block so that each logic block enters the state determined by the state determination unit, wherein the operation/termination information is a termination rate of each logic block, the termination rate being a rate of the respective logic block having stopped operating in the past, and wherein the state determination unit determines the state of each logic block based on the termination rate of the logic block when the operation information indicates the predetermined operation.

7. The terminal system of claim 6, wherein the state determination unit specifies a minimum termination rate between the termination rates of the logic blocks, and determines a state of each logic block having a termination rate whose value is larger than the minimum termination rate by a value determined in accordance with a predetermined method.

8. A terminal system comprising:
a power supply; and
a semiconductor integrated circuit including
(i) a plurality of logic blocks each of which is switchable between a plurality of states pertaining to operation and termination,
(ii) an operation acquisition unit operable to acquire operation information indicating an operation of the power supply,
(iii) a state determination unit operable to determine a state of each of the logic blocks, based on operation/termination information pertaining to a past state of each logic block, when the operation information indicates a predetermined operation in which power saving is unnecessary, and
(iv) a state control unit operable to control each logic block so that each logic block enters the state determined by the state determination unit,
wherein each of the states pertaining to operation and termination has a different deterioration degree from each other, and
wherein the state determination unit specifies the deterioration degree of each of the logic blocks based on the operation/termination information of the respective logic block, and determines a state of each logic block such that the larger the deterioration degree is, the smaller a state of the deterioration degree is, based on the specified deterioration degree of each logic block.

9. A terminal system comprising:
a power supply; and
a semiconductor integrated circuit including
(i) a plurality of logic blocks each of which is switchable between a plurality of states pertaining to operation and termination,
(ii) an operation acquisition unit operable to acquire operation information indicating an operation of the power supply,
(iii) a state determination unit operable to determine a state of each of the logic blocks, based on operation/termination information pertaining to a past state of each logic block, when the operation information indicates a predetermined operation in which power saving is unnecessary, and (iv) a state control unit operable to control each logic block so that each logic block enters the state determined by the state determination unit, wherein the plurality of states of the logic blocks include a operation state in which the respective logic block is in operation and a termination state in which the respective logic block is not in operation, wherein the power supply operates in a charge operation or a discharge operation, wherein the operation acquisition unit is operable to acquire operation information indicating whether the power supply is operating in the charge operation or the discharge operation, wherein the operation/termination information is a termination rate of each logic block, the termination rate being a rate of the respective logic block having stopped operating in the past, and wherein the state determination unit determines a state of each of the logic blocks such that when the power supply is operating in the charge operation the state of each logic block is determined based on the termination rate thereof, and when the power supply is operating in the discharge operation the state of each logic block is determined based on whether the respective logic block needs to be operated for execution of a target process.

10. A method for controlling a semiconductor integrated circuit including a plurality of logic blocks each of which is switchable between a plurality of states pertaining to operation and termination, the control method being performed in the semiconductor integrated circuit and comprising:
acquiring operation information indicating an operation of a power supply;
determining a state of each of the logic blocks, based on operation/termination information pertaining to a past state of each logic block, when the operation information indicates a charge operation of the power supply in which power saving is unnecessary;
controlling each logic block so that each logic block enters the state determined by said determining operation, and
wherein said determining operation further includes determining a state of each logic block that needs to be operated for an execution of a target process to be an operation state in which the respective logic block is in operation when the operation information indicates a discharge operation of the power supply in which power saving is necessary.

11. A method for controlling a semiconductor integrated circuit including a plurality of logic blocks each of which is switchable between a plurality of states pertaining to operation and termination, the control method being performed in the semiconductor integrated circuit and comprising:
acquiring operation information indicating an operation of a power supply;
determining a state of each of the logic blocks, based on operation/termination information pertaining to a past state of each logic block, when the operation information indicates a predetermined operation in which power saving is unnecessary; and
controlling each logic block so that each logic block enters the state determined by the state determination unit,
wherein the operation/termination information is a termination rate of each logic block, the termination rate being a rate of the respective logic block having stopped operating in the past, and wherein said determining step includes determining the state of each logic block based on the termination rate of the logic block when the operation information indicates the predetermined operation.

12. The method of claim 11, wherein said determining step includes specifying a minimum termination rate between the termination rates of the logic blocks, and determining a state of each logic block having a termination rate whose value is larger than the minimum termination rate by a value determined in accordance with a predetermined method.

13. A method for controlling a semiconductor integrated circuit including a plurality of logic blocks each of which is switchable between a plurality of states pertaining to operation and termination, the control method being performed in the semiconductor integrated circuit and comprising:
    acquiring operation information indicating an operation of a power supply;
    determining a state of each of the logic blocks, based on operation/termination information pertaining to a past state of each logic block, when the operation information indicates a predetermined operation in which power saving is unnecessary; and
    controlling each logic block so that each logic block enters the state determined by the state determination unit,
    wherein each of the states pertaining to operation and termination has a different deterioration degree from each other, and
    wherein said determining state includes specifying the deterioration degree of each of the logic blocks based on the operation/termination information of the respective logic block, and determining a state of each logic block such that the larger the deterioration degree is, the smaller a state of the deterioration degree is, based on the specified deterioration degree of each logic block.

14. A method for controlling a semiconductor integrated circuit including a plurality of logic blocks each of which is switchable between a plurality of states pertaining to operation and termination, the control method being performed in the semiconductor integrated circuit and comprising:
    acquiring operation information indicating an operation of a power supply;
    determining a state of each of the logic blocks, based on operation/termination information pertaining to a past state of each logic block, when the operation information indicates a predetermined operation in which power saving is unnecessary; and
    controlling each logic block so that each logic block enters the state determined by the state determination unit,
    wherein the plurality of states of the logic blocks include a operation state in which the respective logic block is in operation and a termination state in which the respective logic block is not in operation,
    wherein the power supply operates in a charge operation or a discharge operation,
    wherein the acquiring operation information indicates whether the power supply is operating in the charge operation or the discharge operation,
    wherein the operation/termination information is a termination rate of each logic block, the termination rate being a rate of the respective logic block having stopped operating in the past, and
    wherein said determining step includes determining a state of each of the logic blocks such that when the power supply is operating in the charge operation the state of each logic block is determined based on the termination rate thereof, and when the power supply is operating in the discharge operation the state of each logic block is determined based on whether the respective logic block needs to be operated for execution of a target process.

15. A semiconductor integrated circuit comprising:
    a plurality of logic blocks each of which is switchable between a plurality of states pertaining to operation and termination;
    an operation acquisition unit operable to acquire operation information indicating an operation of a power supply;
    a state determination unit operable to determine a state of each of the logic blocks, based on operation/termination information pertaining to a past state of each logic block, when the operation information indicates a predetermined operation in which power saving is unnecessary; and
    a state control unit operable to control each logic block so that each logic block enters the state determined by the state determination unit,
    wherein the plurality of states of the logic blocks include a operation state in which the respective logic block is in operation and a termination state in which the respective logic block is not in operation,
    wherein the operation acquisition unit is operable to acquire operation information indicating whether the power supply is operating in a charge operation or a discharge operation,
    wherein the operation/termination information is a termination rate of each logic block, the termination rate being a rate of the respective logic block having stopped operating in the past, and
    wherein the state determination unit determines a state of each of the logic blocks such that when the power supply is operating in the charge operation the state of each logic block is determined based on the termination rate thereof, and when the power supply is operating in the discharge operation the state of each logic block is determined based on whether the respective logic block needs to be operated for execution of a target process.

* * * * *